(12) United States Patent  
Andrews, Jr. et al.

(10) Patent No.: US 7,843,046 B2
(45) Date of Patent: Nov. 30, 2010

(54) FLAT LEADLESS PACKAGES AND STACKED LEADLESS PACKAGE ASSEMBLIES

(75) Inventors: Lawrence Douglas Andrews, Jr., Los Gatos, CA (US); Jeffrey Leal, Santa Cruz, CA (US); Simon J. S. McElrea, Scotts Valley, CA (US)

(73) Assignee: Vertical Circuits, Inc., Scotts Valley, CA (US)

( * ) Notice: Subject to any disclaimer, the term of this patent is extended or adjusted under 35 U.S.C. 154(b) by 0 days.

(21) Appl. No.: 12/199,667

(22) Filed: Aug. 27, 2008

(65) Prior Publication Data

US 2009/0206458 A1    Aug. 20, 2009

Related U.S. Application Data

(60) Provisional application No. 61/029,617, filed on Feb. 19, 2008.

(51) Int. Cl.
*H01L 23/495* (2006.01)

(52) U.S. Cl. ............. 257/676; 257/666; 257/E23.037

(58) Field of Classification Search ............. 257/666, 257/676, 686, E23.037
See application file for complete search history.

(56) References Cited

U.S. PATENT DOCUMENTS

| | | | |
|---|---|---|---|
| 4,996,583 A | 2/1991 | Hatada et al. | |
| 5,111,278 A | 5/1992 | Eichelberger | |
| 5,128,831 A | 7/1992 | Fox, III et al. | |
| 5,135,556 A | 8/1992 | Hornback et al. | |
| 5,172,303 A | 12/1992 | Bernardoni et al. | |
| 5,434,745 A | 7/1995 | Shokrgozar et al. | |
| 6,091,136 A * | 7/2000 | Jiang et al. | 257/676 |
| 6,225,689 B1 | 5/2001 | Moden et al. | |
| 6,337,510 B1 | 1/2002 | Chun-Jen et al. | |
| 6,426,549 B1 * | 7/2002 | Isaak | 257/686 |
| 6,459,148 B1 | 10/2002 | Chun-Jen et al. | |
| 6,686,655 B2 | 2/2004 | Moden et al. | |
| 7,064,010 B2 | 6/2006 | Farnworth et al. | |
| 7,193,312 B2 * | 3/2007 | Boon et al. | 257/690 |
| 7,598,611 B2 * | 10/2009 | Takayama | 257/730 |
| 2006/0081966 A1 | 4/2006 | Farnworth et al. | |
| 2007/0252262 A1 | 11/2007 | Robinson et al. | |

OTHER PUBLICATIONS

International Search Report, mailed Aug. 26, 2009, PCT Application No. US/2009/034368.

* cited by examiner

*Primary Examiner*—Roy K Potter
(74) *Attorney, Agent, or Firm*—Bill Kennedy; Haynes Beffel & Wolfeld LLP

(57) ABSTRACT

A flat leadless package includes at least one die mounted onto a leadframe and electrically connected to leads using an electrically conductive polymer or an electrically conductive ink. Also, an assembly includes stacked leadless packages electrically connected to leads using an electrically conductive polymer or an electrically conductive ink. Also, a package module includes an assembly of stacked leadless packages mounted on a support and electrically connected to circuitry in the support using an electrically conductive polymer or an electrically conductive ink.

34 Claims, 13 Drawing Sheets

FLAT LEADLESS PACKAGES AND STACKED LEADLESS PACKAGE ASSEMBLIES

CROSS-REFERENCE TO RELATED APPLICATIONS

This application claims priority from L. D. Andrews et al. U.S. Provisional Application No. 61/029,617, filed Feb. 19, 2008, titled "Flat leadless packages and stacked leadless package assemblies", which is hereby incorporated herein by reference.

BACKGROUND

This invention relates to integrated circuit device packaging.

A conventional leadframe semiconductor die package has a semiconductor die mounted onto and electrically connected to a leadframe. The leadframe, which may be formed by patterning a sheet of electrically conductive metal such as copper, typically includes a die paddle, onto which the die is affixed, and leads, to which the die is electrically connected. The mounted die may be encapsulated or molded, and the leads may project from one or more sidewalls of the molding or encapsulation (a "leaded package"); or the leads may end at one or more of the sidewalls of the molding or encapsulation (a "leadless package").

An encapsulated leadless package is shaped generally as a thin rectangular parallepiped having larger rectangular or square upper and lower sides. Typically, lower surfaces of the die paddle and leads are exposed at the lower side of the package, and end surfaces of the leads are exposed at (and are generally flush with) one or more sidewalls of the package. Thus a typical leadless semiconductor die package appears on the surface as a thin rectangular or square solid block of the molding or encapsulation material, with die paddle surfaces exposed flush with the "underside" of the package and leads exposed flush with the underside and with one or more of the sidewalls of the package adjacent the lower edges. A quad flat no lead ("QFN") package has leads exposed flush with the sidewalls adjacent all four lower edges, and a dual flat no lead ("DFN") package has leads exposed flush with the sidewalls adjacent two (typically opposite) lower edges.

In a conventional leadframe package the die may be electrically connected by wire bonds or by flip-chip interconnection.

In a wire-bonded leadframe package the die is affixed "die-up", that is, oriented so that the active side of the die faces away from the leadframe, and in such a package the die is electrically connected to the leads by wires connecting interconnect pads on the die with bond sites on the leads. Wire bonding requires that the package have both a significantly greater thickness than the die, because of the wire bond "loop height", and a significantly greater footprint, because of the "wire span". Additionally, although two or more die may be stacked one over another in a wire bonded leadframe package, where an upper die in a stack of wire bonded die overlaps the interconnect pads of an underlying die, a spacer must be interposed between the die to accommodate the wire loops on the underlying die. This adds still further package thickness, and additional processing steps.

In a flip-chip leadframe package the die is mounted "die-down", that is, oriented so that the active side of the die faces toward the leadframe, and in such a package the die is electrically connected to the leads by solder bumps or so-called "stud bumps" interposed between the die pads and the bond sites on the leads. Flip-chip interconnect can provide a smaller footprint than a wire bonded comparably dimensioned die, but stacking of flip chip die is impractical.

SUMMARY

In one general aspect the invention features a flat leadless package having at least one die mounted onto a leadframe and electrically connected to leads using an electrically conductive polymer or an electrically conductive ink.

In some embodiments a stack of two or more die are mounted onto the leadframe. The die may variously be mounted die-down (such that the active side of the die faces toward the leadframe), or die-up (such that the back side of the die faces toward the leadframe); and in some embodiments one or more die in a stack may be oriented die-up while one or more others may be oriented die-down.

In some embodiments the die include memory die, such as NAND die. Where a stack of die are mounted onto the leadframe, two or more die in the stack may variously have the same dimensions (and may be the same type of die), or different dimensions. The die pads are typically arranged in one or more rows in a margin along or adjacent at least one edge of the die (an "interconnect edge"), and in some embodiments one or more interconnect edges of an overlying die in a stack may be superimposed; in other embodiments one or more interconnect edges of a first die in a stack may be offset in relation to the interconnect edge of the second die.

In some embodiments the interconnect material is an electrically conductive polymer. Suitable electrically conductive polymers include polymers filled with conductive material in particle form such as, for example, metal-filled polymers, including for example metal filled epoxy, metal filled thermosetting polymers, metal filled thermoplastic polymers, or an electrically conductive ink. The conductive particles may range widely in size and shape; they may be for example nanoparticles or larger particles.

The interconnect material may be a curable material and, depending upon the material and the technique, the interconnect material may be deposited in an uncured or partially cured state, and the material may be partially or additionally cured at an intermediate stage following dispense, and may be fully cured when dispense has been completed. Where the interconnect material is a curable material, it may be electrically conductive as deposited, or as partially or fully cured. In some embodiments the interconnect material can be a partially-curable polymer; a partial cure may be performed at an earlier stage in the process, and a final cure or post-cure may be performed at a later stage to increase the robustness of the interconnection. In some embodiments the interconnect material provides a mechanical strength (for example, helping to hold the die together in the stack) as well as a reliable electrical interconnection.

In another general aspect the invention features an assembly of stacked flat leadless packages, interconnected using an electrically conductive polymer or an electrically conductive ink. The packages in the assembly may be, variously, conventional flat leadless packages, containing one or more wire bonded die or containing flip-chip die, or flat leadless packages having at least one die mounted onto a leadframe and electrically connected to leads using an electrically conductive polymer or an electrically conductive ink. The end surfaces of the leads are exposed at one or more sidewalls of the package. In some embodiments of a package the end surfaces of the leads may be generally flush with at least a portion of the sidewall; in other embodiments the end surfaces of the leads may be recessed with respect to a plane of at least a portion of the sidewall. The flat leadless packages in the assembly variously may include one die, or may include two or more die; and may include one or more stacks of die. The packages in a stack may variously have the same dimensions (and may be the same type of package, that is, having the same type of functionality), or different dimensions (and may be different types of package).

In another general aspect the invention features package modules including a flat leadless package or an assembly of stacked flat leadless packages, interconnected using an electrically conductive polymer or an electrically conductive ink and electrically connected to circuitry in an underlying support. The packages in the assembly may be, variously, conventional flat leadless packages, containing one or more wire bonded die or containing flip-chip die, or flat leadless packages having at least one die mounted onto a leadframe and electrically connected to leads using an electrically conductive polymer or an electrically conductive ink. The underlying support may be, for example, a substrate, or a printed circuit board such as a motherboard or daughterboard or the like, or a module leadframe, or a semiconductor die or a non-leadframe semiconductor package. Where a stack of packages are mounted onto the support, two or more packages in the stack may have the same dimensions (and may be the same type of package), or different dimensions. In some modules, two or more leadless packages may be mounted on the support, or two or more assemblies of stacked leadless packages may be mounted on the support, or at least one stacked leadless package and at least one assembly of stacked leadless packages may be mounted on the support. The module may be overmolded or encapsulated to provide a fully enclosed stacked package module.

The flat leadless packages and the flat leadless package assemblies and package modules according to the invention can be used for building computers, telecommunications equipment, and consumer and industrial electronics devices.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs. Also for clarity of presentation certain features are not shown in the FIGs., where not necessary for an understanding of the invention.

Stacked Flat Leadless Package Assemblies and Stacked Leadless Package Modules

Figure 1:
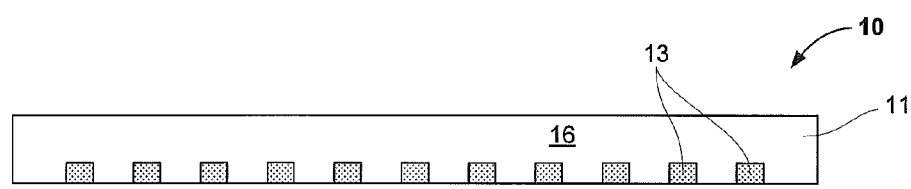
FIG. 1 is a diagrammatic sketch showing a flat leadless package in an elevational view.

Stacked flat leadless package assemblies and stacked flat leadless package modules will now be described. Referring now to FIG. 1, there is shown generally at 10 an example of a flat leadless package suitable for stacking. The package has been encapsulated to provide a package body 11. In this elevational view only a package sidewall appears, showing lead ends 13 exposed at the surface 16. The encapsulation material may be any non-conductive material, and may for example be an injection molded polymer based material. Conventionally, a flat leadless package is made by providing a connected row or array of leadframes, mounting the die on the leadframes to form a row or array of mounted die, electrically connecting the die to lead portions of the leadframes to form a row or array of electrically connected die mounted on leadframes, encapsulating the entire row or array, and singulating individual packages from the row or array using a punch or a saw. Accordingly, the view of FIG. 1 shows a cut or sawn face (package sidewall). Where a flat leadless package has leads on all four sidewalls, it is conventionally referred to by terms such as quad flat no lead ("QFN") package; and where a flat leadless package has leads on two opposite sidewalls, it is conventionally referred to by terms such as dual flat no lead ("DFN") package. Accordingly, for purposes of illustration, the package 10 as shown may be either a DFN package or a QFN package; or, it may in fact have lead ends exposed only on the sidewall 16 that is in view.

Figure 2:
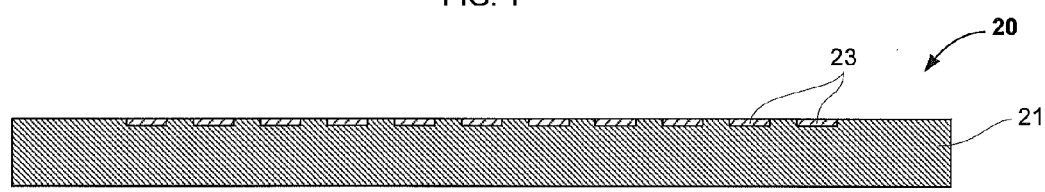
FIG. 2 is a diagrammatic sketch in a sectional view showing a substrate.

FIG. 2 shows a generalized substrate 20, in diagrammatic sectional view thru a row of interconnect sites 23 that are formed in the dielectric material 21 making up the substrate support. The substrate 20 and the package 10 are designed or selected so that the lead ends 13 and the interconnect sites 23 can be aligned; that is, they have substantially the same pitch, and the substrate is configured so that the sites are arranged in a row over which the package face 16 can be situated.

Figure 3:
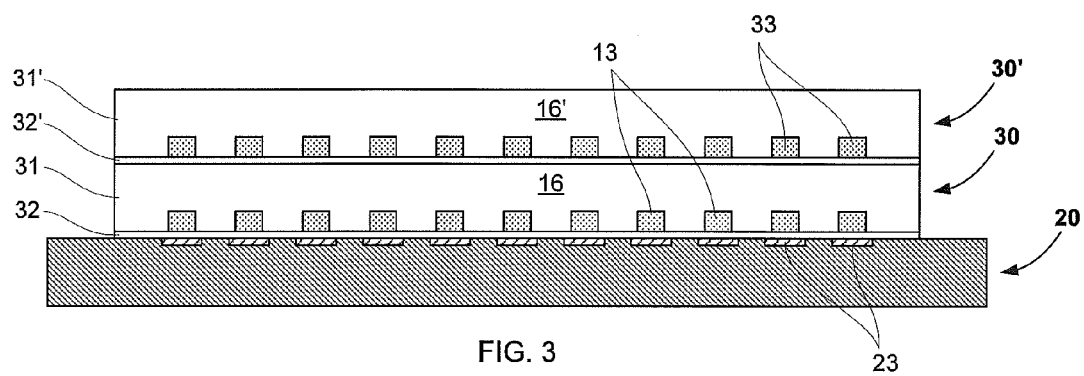
FIG. 3 is a diagrammatic sketch in sectional view showing a stack of two flat leadless packages as in FIG. 1, mounted upon a substrate as in FIG. 2, according to an embodiment of the invention.

FIG. 3 shows a first flat leadless package 30 similar to package 10 in FIG. 1, mounted upon a substrate 20 generally as in FIG. 2, and affixed to a package mount surface of the substrate using an adhesive 32. The apparent sidewall surface 16 of package 30 shows the encapsulation 31 and exposed lead ends 13. Also FIG. 3 shows a second flat leadless package 30' similar to package 10 in FIG. 1, mounted upon the first flat leadless package 30, and affixed to the first flat leadless package 30 using an adhesive 32'. The apparent sidewall surface 16' of package 30' shows the encapsulation 31' and exposed lead ends 33. In this embodiment the lead ends 13 are generally aligned with the lead ends 33.

Figure 4A:
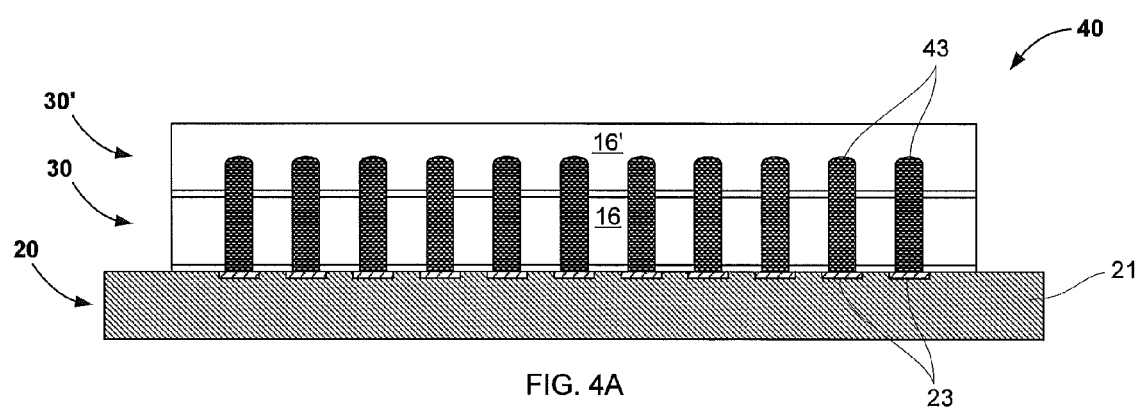
FIG. 4A is a diagrammatic sketch in sectional view showing a stacked flat leadless package module including a stack of two flat leadless packages as in FIG. 1, mounted upon a substrate as in FIG. 2, and electrically interconnected with circuitry on the substrate according to an embodiment of the invention.
Figure 4B:
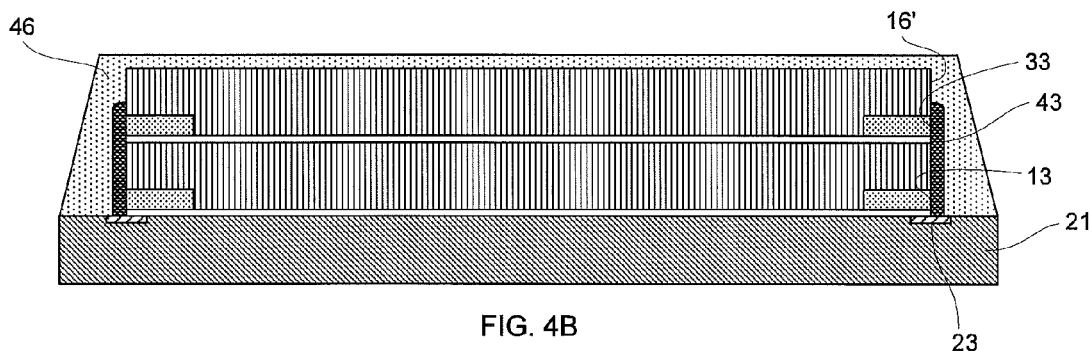
FIG. 4B is a diagrammatic sketch showing a stacked flat leadless package module as in FIG. 4A, in a sectional view at right angles to the view in FIG. 4A.

FIG. 4A shows first and second flat leadless packages 30, 30' mounted on a substrate 20 generally as in FIG. 3, and electrically connected to the substrate. The interconnects 43 are formed by applying a conductive polymer or conductive ink onto the face (16, 16') of the stacked packages, in a pattern generally of lines or traces contacting the respective lead ends 33, 13, and interconnect sites 23. This structure is shown in an alternative view in FIG. 4B, rotated at right angles and in a sectional view to show the leads, and their ends flush with the package sidewall surfaces (e.g., 16'). Optionally the package module may be overmolded as shown at 46 in FIG. 4B to protect the interconnections.

A structure as shown for example in FIGS. 3 and 4 can be constructed by mounting the flat leadless packages serially, that is, by mounting the first leadless package on the substrate, and then mounting the second leadless package on the first package; and mounting additional packages one-by-one on the second package. Or, an assembly of stacked flat leadless packages can be made, and the assembly can be mounted on the substrate. As may be appreciated, the interconnect material may be applied onto a construct after the packages are mounted onto the substrate, as illustrated in FIG. 3; or, the interconnect material may be applied to a stacked package assembly prior to mounting the stacked package assembly onto the substrate. The electrical interconnections may be made in any desired sequence: for example, where an assembly of packages is mounted on the substrate the package-to-package electrical interconnections may be formed in the assembly, and thereafter the electrical connection of the assembly to the substrate may be formed; or, alternatively, a noninterconnected assembly of packages may be mounted on the substrate, and thereafter the package-to-package and assembly-to-substrate electrical interconnection can be made in one operation.

The interconnect material may be, for example, an electrically conductive polymer; or a conductive ink. The interconnect material may be a metal trace or a metallization, and may for example be formed by electroless plating onto a patterned plating primer. Suitable primers include materials that are applied in a flowable state, such as certain sinterable materials. The interconnect material may be a curable conductive polymer, for example, such as a curable epoxy; and the interconnect process may include forming traces of the uncured material in a prescribed pattern and thereafter curing the polymer to secure the electrical contacts with the lead ends and the interconnect sites and the mechanical integrity of the traces between them. The interconnect material is applied using an application tool such as, for example, a syringe or a nozzle or a needle. The material is applied by the tool in a deposition direction generally toward the lead ends at the sidewall surface, and the tool is moved over the presented die sidewall of die stack face in a work direction. The material may be extruded from the tool in a continuous flow, or, the material may exit the tool dropwise. In some embodiments the material exits the tool as a jet of droplets, and is deposited as dots which coalesce upon contact, or following contact, with a stack face surface. In some embodiments the deposition direction is generally perpendicular to the stack face surface, and in other embodiments the deposition direction is at an angle off perpendicular to the stack face surface. The tool may be moved in a generally linear work direction, or in a zig-zag work direction, depending upon the location on the various packages of the corresponding lead ends to be connected.

Optionally, a plurality of deposition tools may be held in a ganged assembly or array of tools, and operated to deposit one or more traces of material in a single pass.

Alternatively, the material may be deposited by pin transfer or pad transfer, employing a pin or pad or ganged assembly or array of pins or pads.

The application of the interconnect material may be automated; that is, the movement of the tool or the ganged assembly or array of tools, and the deposition of material, may be controlled robotically, programmed as appropriate by the operator.

Alternatively the interconnect material may be applied by printing, for example using a print head (which may have a suitable array of nozzles), or for example by screen printing or using a mask.

As noted above, the interconnect material is applied in a flowable state. Accordingly, it is not necessary that the package sidewalls to be interconnected be planarized, or that they be perfectly aligned. A tolerance for misalignment can obviate a requirement for precise positioning of the packages in the stack, or on or in relation to the module substrate.

It is necessary to avoid occlusion of the lead ends by the adhesive when mounting the packages to one another or in mounting the first package to the substrate. Any mounting adhesive may be used that provides adequately reliable fixation, so long as the adhesive can be applied and processed without covering an unacceptable area of the lead ends. A liquid adhesive may flow or creep and, accordingly, a film adhesive may be preferred, such as a B-staged epoxy film, which can be applied to each package before stacking. A conventional die attach film ("DAF") may be particularly suitable, for example.

The area of the exposed lead end must be at least sufficient to conduct adequate electrical current for device operation; the area may be greater than necessary. A greater or lesser area may be required, depending upon the mechanical and electrical properties of the interconnect material and of the material at the exposed lead end. Typical leadframe materials include conductive metals such as copper, for example; typical leadframe materials are selected for good match of thermal expansion with the die and encapsulant. The lead end may be modified or provided with a layer or film of a material whose material properties provide a better surface for electrical interconnection by the conductive polymer or ink. Such a material may be plated in an electroless plating process, for example.

As may be appreciated, a construct as in FIG. 3 may be made by mounting a first package onto the substrate and then mounting a second package onto the first package; or, a construct as in FIG. 3 may be made by stacking the second package and the first package to form a stacked package assembly, and then mounting the assembly onto the substrate.

Assemblies of electrically interconnected stacked packages can optionally be tested prior to further processing. Complete assemblies can be mounted on a support, and interconnected packages in the stack can be connected with underlying circuitry by way of secured electrical contact with the interconnections. For example, a printed circuit board can be provided, having bond pads arranged to correspond with the ends of the package stack interconnects.

In the foregoing example the package body has the shape of a simple rectangular parallelepiped, resulting for example from the singulation cut passing through the entire encapsulated package component in a plane generally perpendicular to the plane of the package footprint. In these configurations the interconnect material contacts the lead ends, whether flush or recessed from the adjacent sidewall portions. In other embodiments, illustrated for example in FIGS. 18, 19, 20A, 20C, the package body may be molded or cut so that the portion of the package body above the leadframe is beveled.

Figure 18:
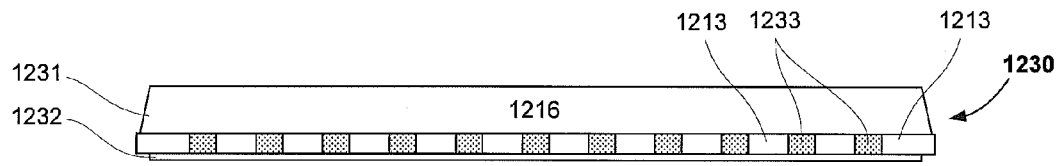
FIG. 18 is a diagrammatic sketch showing a flat leadless package according to an embodiment of the invention in an elevational view.

Referring now to FIG. 18, there is shown an example of a flat leadless package 1230 suitable for stacking. An upper portion 1216 of the package body 1231, containing principally the die mounted on the leadframe, is beveled (in the example shown it has the shape of a broad truncated pyramid). A lower portion 1213 of the package body contains the leadframe itself, and this portion may constitute the sidewall of the package body, substantially perpendicular to the package footprint, at which the lead ends 1233 are exposed (either generally flush, or recessed as described below with reference to FIGS. 9, 10A, 10B). Such a configuration may be made, for example, by molding the row or array of packages both to form the beveled shape of the upper portion of the package body and to fill the patterned leadframe, and then punching or sawing to singulate the packages and to form the lower sidewall portion of the package body, with the exposed lead ends. Also FIG. 18 shows an adhesive film 1232 laminated onto the lower surface of the package 1230, by which the package may be affixed onto another package or onto a support.

Figure 19:
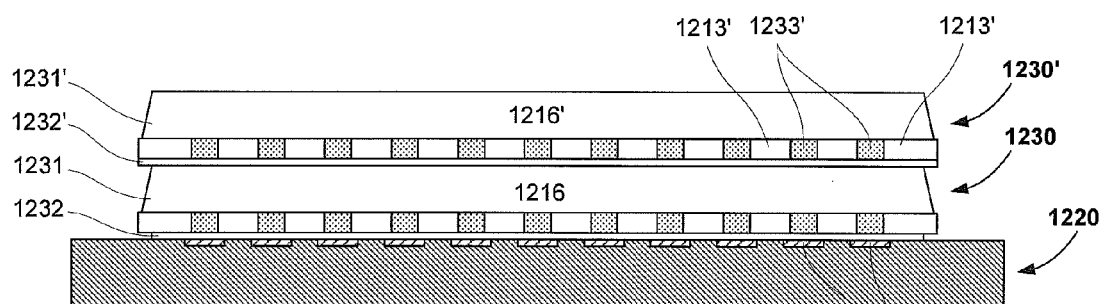
FIG. 19 is a diagrammatic sketch in sectional view showing a stack of two flat leadless packages as in FIG. 18 mounted upon a substrate according to another embodiment of the invention.

FIG. 19 shows a first beveled flat leadless package 1230 mounted onto a substrate 1220, and affixed to a package mount surface of the substrate using an adhesive 1232. Also FIG. 19 shows a second flat leadless package 1230' similar to package 1230, mounted upon the first flat leadless package 1230, and affixed to the first flat leadless package 1230 using an adhesive 1232'. Here as in the first package the upper portion 1216' of the package body 1231', containing principally the die mounted on the leadframe, is beveled; and the lower portion 1213' of the package body containing the leadframe itself constitutes the sidewall of the package body, substantially perpendicular to the package footprint, at which the lead ends 1233' are exposed (either generally flush or recessed, as described above).

As noted above with reference to FIGS. 3 and 4A, a construct as in FIG. 19 may be made serially, that is by mounting a first package onto the substrate and then mounting a second package onto the first package (and so on for additional packages as may be desired); or, a construct as in FIG. 19 may be made by stacking the second package and the first package (and additional packages, as may be desired) to form a stacked package assembly, and then mounting the assembly onto the substrate.

Figure 20A:
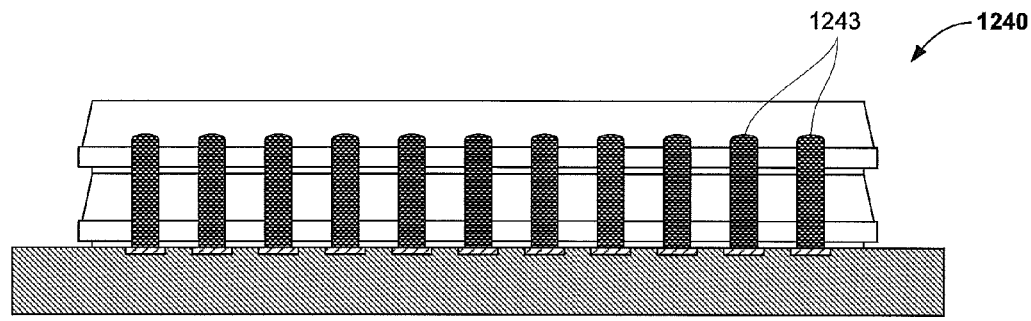
FIG. 20A is a diagrammatic sketch in sectional view showing a stacked flat leadless package module including a stack of two flat leadless packages mounted upon a substrate as in FIG. 19, and electrically interconnected with circuitry on the substrate according to an embodiment of the invention.
Figure 20B:
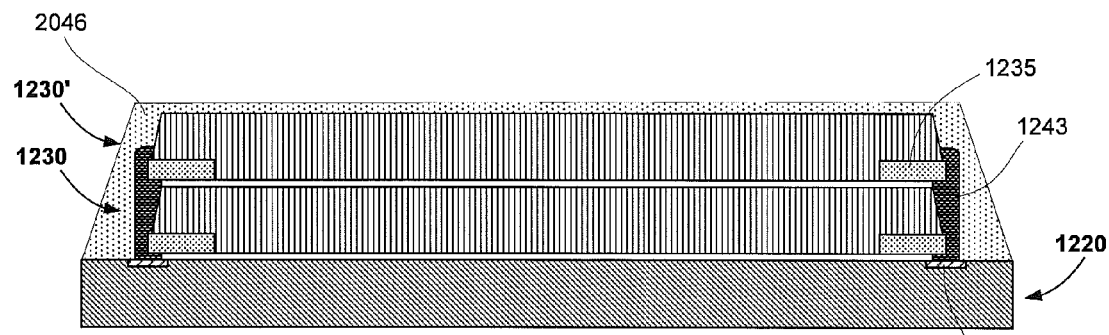
FIG. 20B is a diagrammatic sketch showing a stacked flat leadless package module as in FIG. 20A, in a sectional view at right angles to the view in FIG. 20B.

FIG. 20A shows first and second flat leadless packages 1230, 1230' mounted on a substrate 1220 generally as in FIG. 19, and electrically connected to the substrate. The interconnects 1243 are formed by applying a conductive polymer or conductive ink onto the face (1216, 1216') of the stacked packages, in a pattern generally of lines or traces contacting the respective lead ends on the packages, and interconnect sites 1223 on the substrate. This structure is shown in an alternative view in FIG. 20B, rotated at right angles and in a sectional view to show the leads. As FIG. 20B shows, the interconnect material flows to some extent into the beveled shape of upper portion 1216 of the package body. As noted above the lead ends 1233 are flush with (or recessed from) the laterally adjacent sidewall surface 1213, and the interconnect material contacts the leads at the exposed ends. In these examples the interconnect material additionally contacts a portion of the leads 1235 in a marginal region of the underside of the package, at which the leads are exposed (as shown for example in FIG. 5). This additional contact may provide a mechanically and electrically more robust interconnection. Optionally the package module may be overmolded as shown at 2046 in FIG. 20B to protect the interconnections.

The packages in the stack may be all of the same size, as shown in the FIGs., but packages of different sizes may according to the invention be stacked and interconnected by conductive polymer traces. In some embodiments for example, a smaller package may be stacked on a larger package. In such an arrangement the stack may appear in section as a stepped pyramid; or, the packages may be displaced in one direction with respect to a first package edge, but vertically interconnected on another package edge. An upper package may be larger in one dimension than a lower die (that is, the packages may be same width but one longer than the other), or in both directions (that is, one package both wider and longer than the other). As noted above, exact alignment of the die sidewalls to be interconnected is not required, and in some embodiments it may be desirable to provide a more or less regular offset.

In the examples shown in the FIGs., the packages in the stack are all oriented such that the leadframe side (the "lower" side) of the packages face toward the module substrate upon which the stack is mounted. Alternatively, the packages in the stack can be oriented such that the leadframe side of the packages face away from the module substrate; or, one or more packages in the stack may be orientated differently from the others.

Stacked package assemblies according to the invention may have as many packages as may be desired, and there may as a matter of mechanical design be no upper limit. The illustrated examples show two packages in each stack, but assemblies having more than two packages in the stack are contemplated.

Figure 21A:
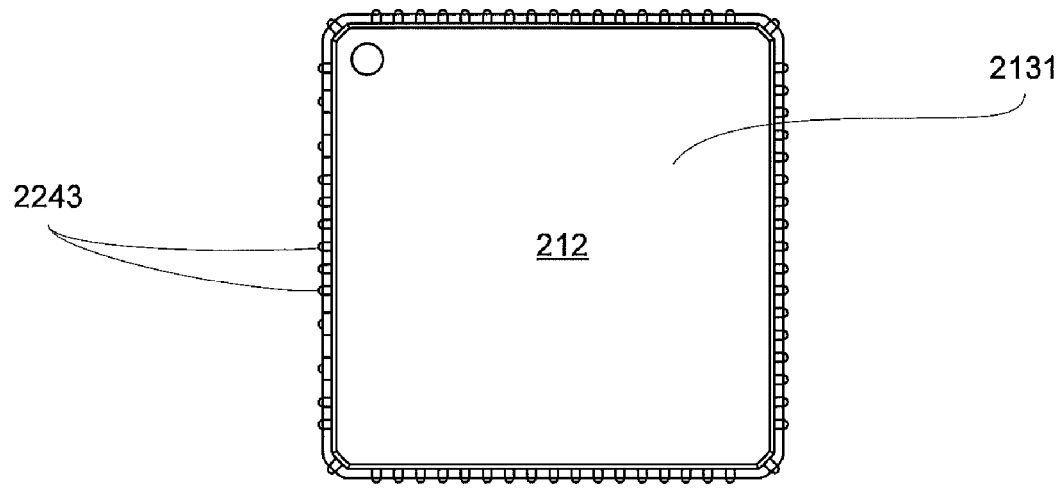
FIGS. 21A, 21B are diagrammatic sketches in plan view showing examples of quad flat leadless packages in two sizes according to an embodiment of the invention.
Figure 21B:
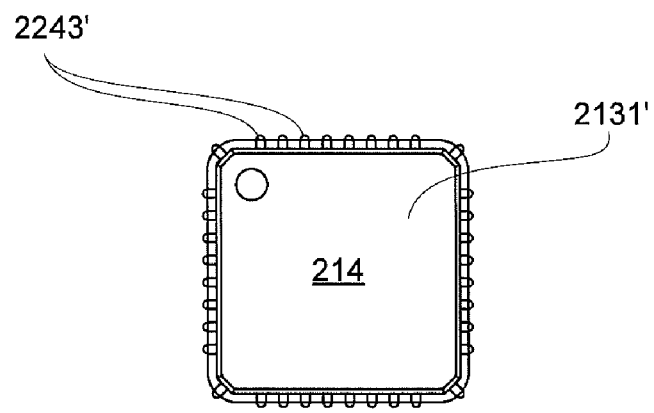

Examples of stackable QFN packages 212, 214, constructed generally as shown for example in FIG. 18, and having different dimensions, are shown in FIGS. 21A and 21B. Here the packages are shown in a plan view with the leadframe side of the package facing away from the viewer, so that the surface 2131, 2131' of the package molding is in view. The larger package 212 may have a footprint about 10 mm×10 mm, for example; and the smaller package 214 may have a footprint about 5 mm×5 mm, for example. As may be appreciated, FIGS. 21A and 21B may each show stacked QFN packages of which the packages 212, 214 are visible (for reference they may be termed the "top" packages in the stack, underlain by "lower" packages). The package 212 (or package stack including package 212 as a "top" package) is provided with interconnects, e.g. 2243, by which the package may be connected with electrical circuitry in a support (not shown in these FIGs.) or by which the packages in a stack may be interconnected and by which the stack may be connected to underlying circuitry in a support. Similarly, the package 214 (or package stack including package 214 as a "top" package) is provided with interconnects, e.g. 2243'.

Figure 22:
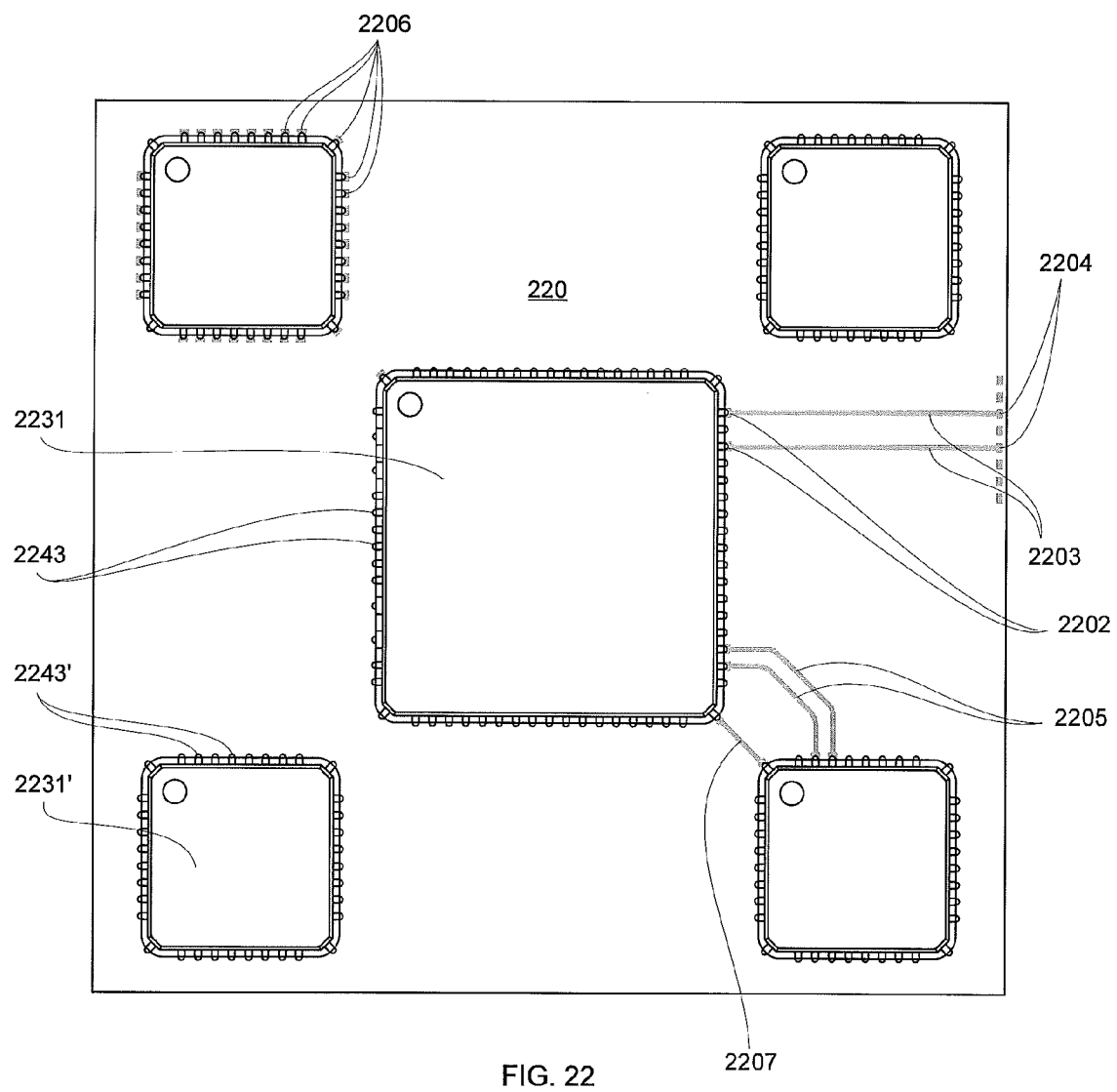
FIG. 22 is a diagrammatic sketch in a plan view showing an example of a module including flat leadless packages stacked over a support.

FIG. 22 is a composite diagram showing various manners in which flat leadless packages and flat leadless package assemblies can be mounted on a support. The package mount surface of the support, which as noted above may be for example a printed circuit board or a module substrate (such as a buildup substrate or a laminated substrate or the like) or an interposer or a larger semiconductor die, is generically represented in FIG. 22 at 220. As illustrated, several (five, for example, in the FIG.) packages or stacked package assemblies may be separately mounted on the support; and the various packages may have different functionalities. For purposes of illustration leadless flat packages or flat package assemblies are shown mounted on the substrate with the leadframe side of the package (or at least of the "upper" package, in the instance where a stacked package assembly is shown) facing away from the viewer and toward the support. Accordingly, the surfaces of package moldings, e.g., 2231, 2231' are in view.

The packages (or package assemblies) are provided with electrical interconnects, e.g., 2243, 2243', by which the packages may be electrically connected with circuitry in the support and by which packages in a stacked package assemblies may be interconnected.

The electrical interconnects are connected to interconnect sites exposed at the surface 220 of the support, and the character and arrangement of the interconnect sites on the support may depend in part upon the type of support and upon the locations of the interconnects on the packages to be mounted on and interconnected with the support.

For example, the support may be a module substrate. It may include at least one layer of patterned electrically conductive traces at the package mount side, which may be covered by a dielectric layer provided with openings exposing the interconnect sites (interconnect pads). The substrate may additionally have a layer of patterned electrically conductive traces at the opposite side, which may include lands or solder ball pads for connection of the module to circuitry in the device in which the module is deployed. Vias through the dielectric layer (or layers) connect the patterned conductive traces of the various layers to provide required electrical routing, as is well known in the package arts. A flat leadless package (or stacked package assembly) may be mounted on the substrate surface 220 and interconnected directly to interconnect pads, as shown e.g., at 2206. The pads may include signal (i/o) pads, power pads, and ground pads; and they are arranged in the substrate at positions appropriate to the particular arrangement of leads in the packages. Circuitry in the substrate may connect interconnect pads associated with one package (or assembly) with interconnect pads associated with another package (or assembly), as shown for example at 2205. For example, a corner lead in a QFN package may be a ground lead, and the interconnect at the corner of the package will be bonded to a suitably situated ground pad in the substrate. For example, circuitry in the substrate may connect a ground pad for one package (or package stack assembly) to the ground pad for another package (or assembly), as shown for example at 2207. (As noted above, the circuitry in the substrate may be covered by a dielectric or passivation layer and, in that case, would not appear in the FIG.) Or, circuitry in the substrate may connect a ground pad for a package (or assembly) to ground lands or ground balls on the opposite side of the substrate (vias through the dielectric between electrical trace layers in the substrate may be employed). Or, circuitry in the substrate (e.g., 2203) may connect interconnect pads (e.g., 2202) associated with a package to exposed pads (e.g., 2204) located (for example at an edge of the substrate) where they can readily be connected to circuitry in the device in which the module is deployed.

Or, for example, the support may be a semiconductor die or an additional package, which may be other than a leadframe package. In some embodiments the support includes a high speed graphics engine or processor, either as a die or as a package including a die. Similar considerations would apply as for a module substrate. Where the support is a die, the die support may be face-up (that is, active-side upward) with respect to the packages mounted over it, in which case connection could be made directly to die pads on the die support (with suitable electrical insulation where required to protect the traces on the die); or the die support may be face-down (that is, backside upward) with respect to the packages mounted over it, in which case conductive traces would be provided from die pads on the active side of the die to interconnect sites on the package mount side (the back side) of the die.

Or, for example, the support may be a printed circuit board. Similar considerations would apply as for a module substrate, except that a PCB may not have lands or balls for LGA or BGA interconnect.

Figure 23:
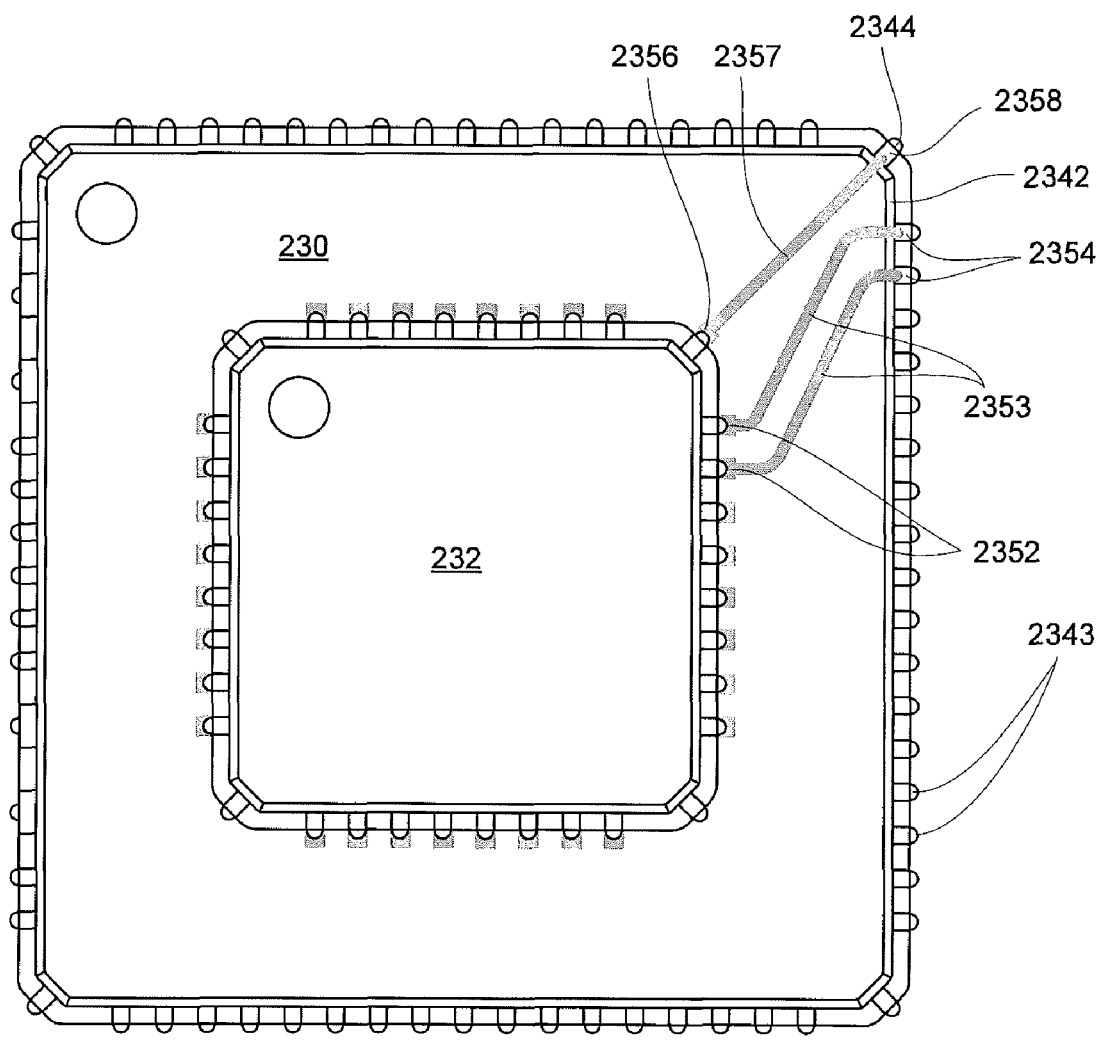
FIG. 23 is a diagrammatic sketch in plan view showing an example of a stacked flat leadless package module including packages having different dimensions.

Or, for example, the support may be another flat leadless package; this is similar to a situation in which stacked leadless package assemblies include a smaller leadless package mounted on and electrically interconnected with a larger leadless package. Such a construct is illustrated by way of example in FIG. 23. Here, by way of example, a smaller leadless package 232 (a QFN package in this example) is mounted upon a larger leadless package 230 (a QFN package in this example). The larger package can be mounted on and interconnected with a further support (not shown in this FIG.) by way of interconnects, e.g., 2343. In this example interconnect pads and connecting traces are provided on the surface of the package 230. The pads are situated to align with electrical interconnects on the package (edge-associated pads, e.g., 2352 and corner-associated pads, e.g., 2356). Connecting traces (corner pad-to-package corner traces, e.g., 2357 and edge pad-to-package edge traces, e.g., 2353 lead from the respective pads to and over the edge 2342 of the larger package molding, and down the molding sidewall to the appropriate lower package leads (e.g. 2354, 2358). In this way, depending upon the configuration of the leads and their connections with the die within the packages, interconnection of the smaller package and the larger package can be made; and interconnection of the packages (individually or together at any given interconnection) to an underlying additional support can be made.

The pads and traces on the surface of the larger package molding can be made for example, using procedures and materials similar to those employed for making the interconnects between packages, or between die, as described herein with reference for example to FIGS. 4A, 4B, 8, 20A, 20B.

The electrically interconnected flat leadless package module can be overmolded or encapsulated to protect the packages and the interconnections.

More than one die may be contained in a flat leadless package for use in constructs of the invention. Where practical, two or more die may be stacked and mounted on the leadframe; this may particularly be so where the die are wire bonded to the leadframe, or where, as described in detail below, the die are themselves electrically connected to the leadframe by an electrically conductive polymer or an electrically conductive ink.

Figure 5:
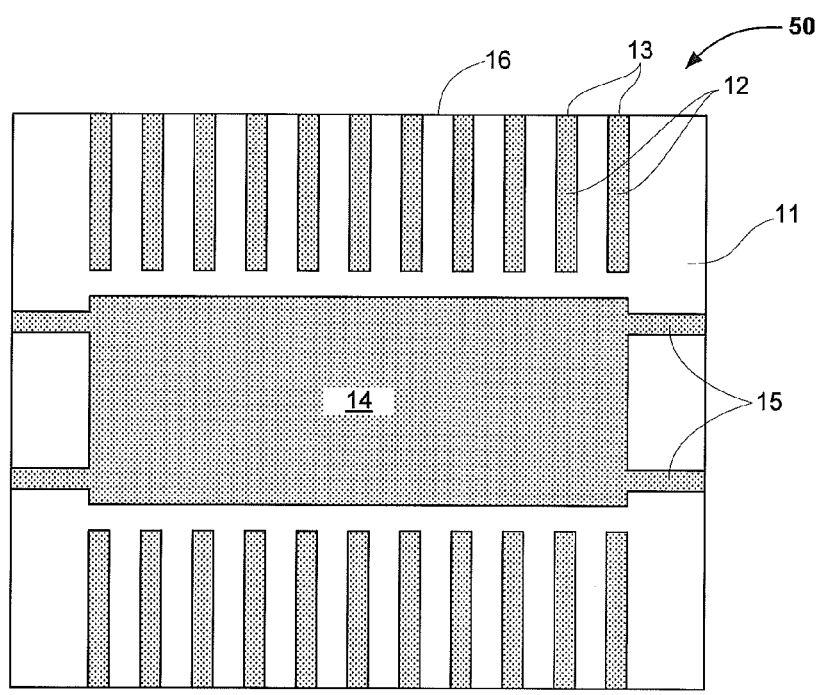
FIG. 5 is a diagrammatic sketch in a plan view showing the underside of a flat leadless package according to an embodiment of the invention.

Flat Leadless Packages Having Die Interconnected Using a Conductive Polymer or Conductive Ink FIG. 5 shows generally at 50 a plan view of the underside of a flat leadless package according to the invention generally as shown in elevational view in FIG. 1. As is apparent, this is a DFN package, having leads adjacent two opposite edges of the package. In this view certain features of the singulated leadframe are exposed. The die paddle 14 is generally centrally situated in this example. The die paddle tie bars 15 are exposed at the underside of the package in this example, as are the leads 12. As the FIG. illustrates, the ends 13 of the leads have been cut off flush with the sidewall 16 during punch or saw singulation.

Figure 6:
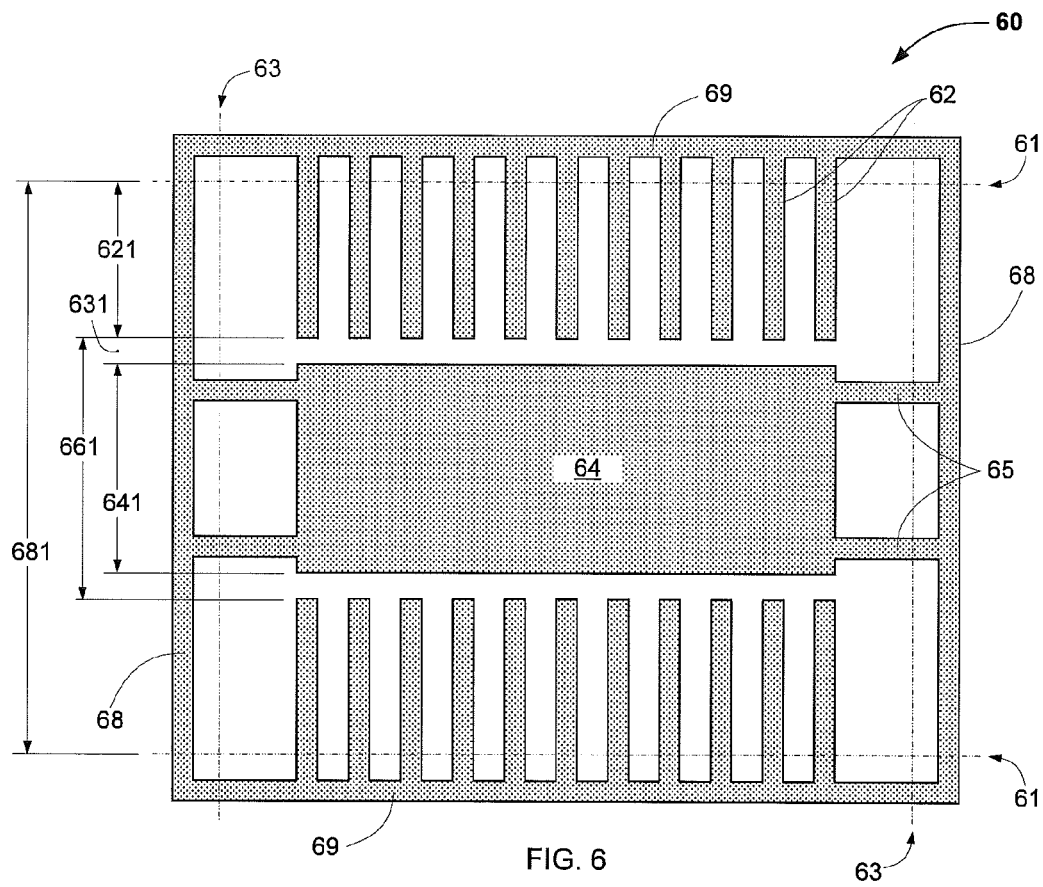
FIG. 6 is a diagrammatic sketch in plan view showing an unsingulated leadframe according to an embodiment of the invention.

An unsingulated leadframe component that might be used to make the flat leadless package of FIG. 5 is shown in a plan view generally at 60 in FIG. 6. The leadframe component includes an edge member 68, 69 by which all the internal members are held in position during processing. The leads 62 are connected to the edge portions 69, and the die paddle 64 is connected to edge portions 68 by way of tie bars 65. Following die mount, die interconnection, and encapsulation (as described below), the package is singulated along singulation loci 63, 61, severing the leads and the die paddle from the edge portions 68, 69. For reference in the discussion following, the die paddle 64 has a width 641; the leads 62 have a length 621, measured from the innermost ends of the leads to the singulation loci 61; there is a gap 631 between the die paddle and the inner ends of the leads; the distance 661 between the inner ends of opposite leads roughly equals the width of the die paddle plus the widths of the gaps on either side of the die paddle; and the full width of the singulated package is the width 681 between opposite singulation loci 61.

Figure 7:
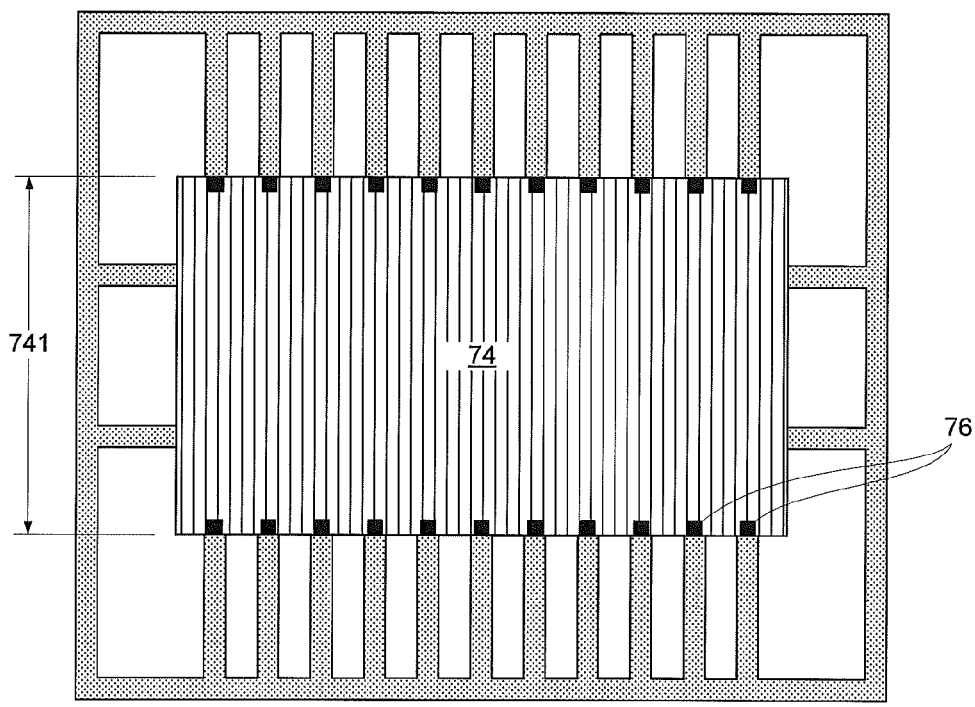
FIG. 7 is a diagrammatic sketch in a plan view showing a die, which may be the upper one of a stack of die, mounted on an unsingulated leadframe as for example in FIG. 6 according to an embodiment of the invention.
Figure 8:
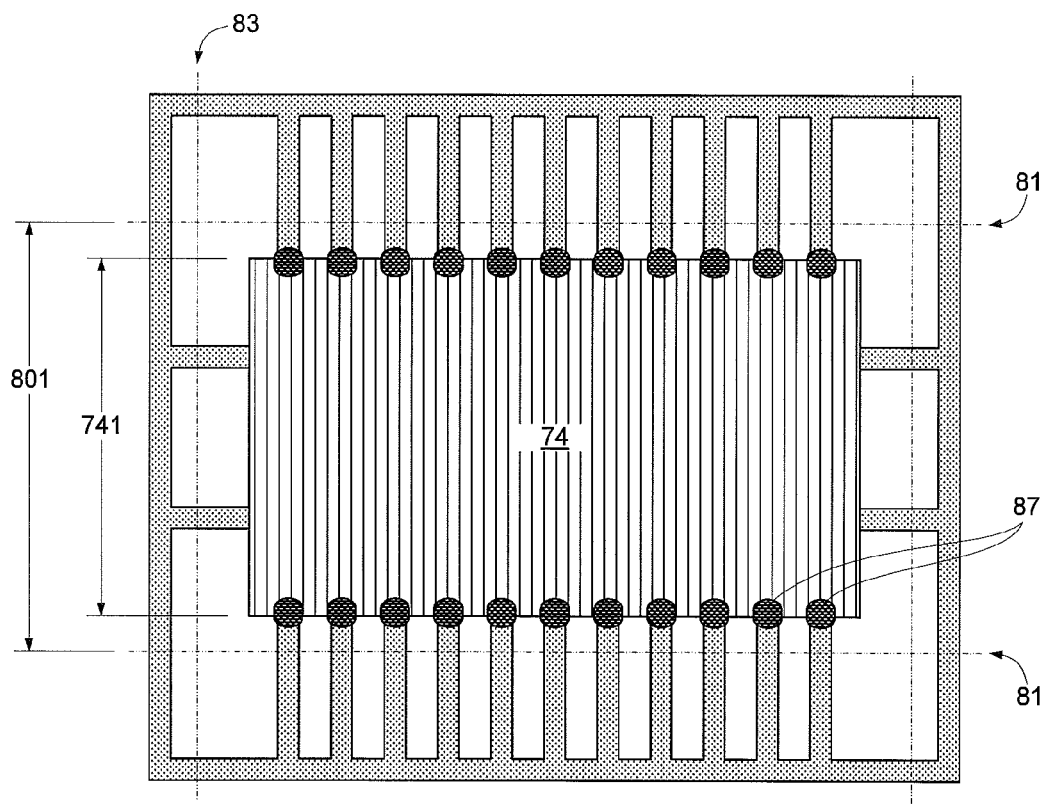
FIG. 8 is a diagrammatic sketch in a plan view showing a die and unsingulated leadframe as in FIG. 7, interconnected and connected to leads according to an embodiment of the invention.

A significance for the invention of these dimensions may be seen with reference to FIGS. 7 and 8. FIG. 7 shows a die 74, which may be in this view be either a single die or the topmost one of a stack of two or more die, mounted on the leadframe component of FIG. 6. Interconnect pads (or interconnect terminals) 76 are arranged in margins adjacent opposite edges of the die 74. The die is situated on the leadframe such that the interconnect pads (or interconnect terminals) on the die are generally aligned with the underlying leads. As shown in FIG. 8, the die 74 (together with underlying die, if any) is electrically connected to the leadframe component by conductive polymer or conductive ink interconnect material 87 contacting the die pads or interconnect terminals 76 to subjacent sites on the leads. As FIGS. 7 and 8 illustrate, a leadframe component 60 as shown in FIG. 6 can be used to mount and interconnect die having a wide range of widths 741. Generally, in order to provide for interconnection of the die to subjacent leads, the distance 661 between the inner ends of opposite leads, that is, the sum of the width of the die paddle plus the widths of the gaps on either side of the die paddle, should be no greater than the width 741 of the die to be used in the package. And generally, in order to make the die and the interconnections fit within the overall package width, the distance 681 between opposite singulation loci 61 should be greater than the width 741 of the die plus any additional dimension of the interconnects themselves. As may be appreciated, the conductive polymer or conductive ink interconnects according to the invention add only a small dimension to the overall width.

Suitable interconnect materials, and processes for forming the interconnects, are as described above for interconnection of stacked packages. As noted above, the interconnect material is applied in a flowable state. Accordingly, it is not necessary that the die sidewalls to be interconnected be planarized, or that they be perfectly aligned. A tolerance for misalignment can obviate a requirement for precise positioning of the die in the stack, or on or in relation to the leadframe.

The die in the examples illustrated herein are mounted "die-down"; that is, they are mounted so that the active side of the die faces toward the leadframe. Alternatively, the die in the package or one or more of the die in a stack of die in the package) may be mounted "die-up"; and one or more die in a stack may variously be mounted either die-up of die-down.

Accordingly, a standardized leadframe component may be made, designed to provide an overall distance between opposite singulation loci that exceeds the width requirement for specified die having a range of die widths. That is, with reference again to FIG. 6, the leadframe component may be dimensioned so that the leads 62 are long enough to provide an overall distance 681 between opposite singulation loci 61 that exceeds the width requirement for a wider die; and to provide a minimum distance 661 between the inner ends of opposite leads that does not exceed the width requirement for narrower die. Such a standardized leadframe may be employed to accommodate a selection of die having a wide range of die widths. Where a narrower die is used, the singulation loci 61 may be moved accordingly to reduce the distance 681; thereby, following die attach and die interconnection and encapsulation, the packages may be made correspondingly narrower. This is illustrated in FIG. 8. Here the die 74 has a width 741, and the singulation loci 81 are located so that the completed package has an overall width 801 somewhat greater than the die width, to accommodate the interconnections 87 plus some nominal tolerance.

In the examples shown, the packages are DFN packages. QFN packages can be constructed according to the invention, by providing a leadframe construct having leads on all four sides, and a die (or stack of die) having interconnect pads on all four sides; mounting the die on the leadframe construct with the die pads aligned with corresponding leads, and interconnecting the pads with the subjacent leads using a conductive polymer or a conductive ink.

As may be appreciated, die of various lengths (as well as various widths) may be accommodated by such a standardized leadframe, whether it has a DFN or a QFN format. The die pads must have generally the same pitch as the leads to which they are connected.

Figure 9:
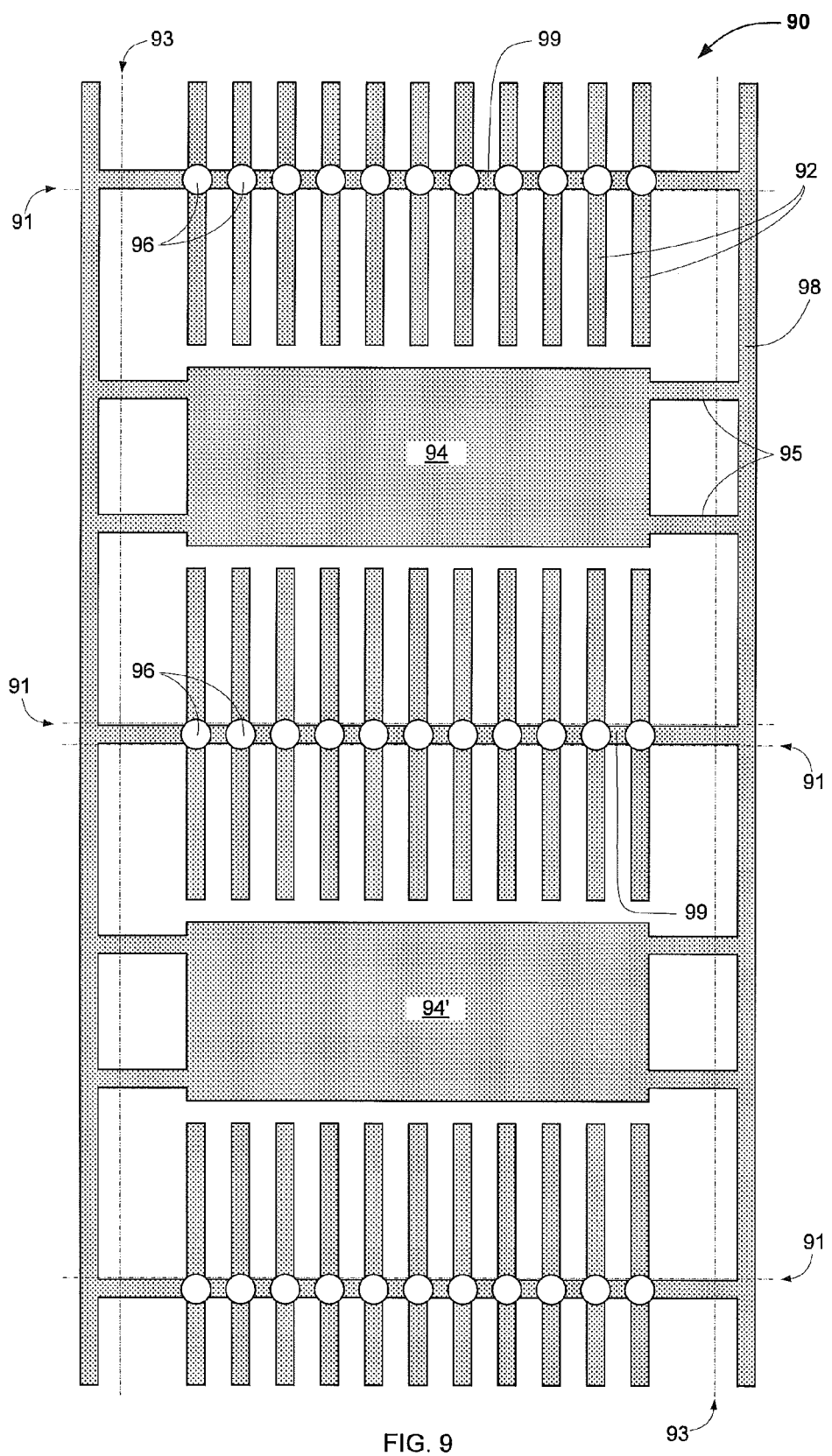
FIG. 9 is a diagrammatic sketch in a plan view toward the underside showing a portion of a series of unsingulated leadframe assemblies, drilled to provide recessed lead ends, according to an embodiment of the invention.
Figure 10A:
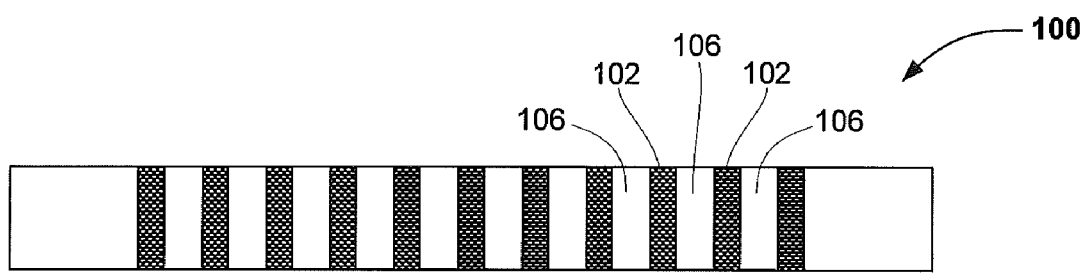
FIG. 10A is a diagrammatic sketch in an elevational view showing a flat leadless package according to an embodiment of the invention.

In the examples illustrated above, the lead ends are flush with the sidewall surface, as a consequence of the cut during singulation. In other embodiments, the exposed lead ends may be recessed. A method for forming recessed lead ends, and the resulting package, are shown for example in FIGS. 9, 10A, and 10B. FIG. 9 shows a portion of a row of package assemblies, viewed from the underside so that exposed leadframe components, are visible, including die pads 94, 94', which are connected by way of tie bars 95 to leadframe edge portions 98, and leads 92. Following die mount and interconnection and encapsulation, the package assemblies are drilled to form through holes (e.g., 96). The holes are positioned and dimensioned so that a cylindrical section of the leads is removed. Consequently, following singulation (by sawing or punching along lines 91 and 93), the leads are recessed from the sidewall surface of the resulting package, as shown by way of example in FIGS. 10A and 10B.

Figure 10B:
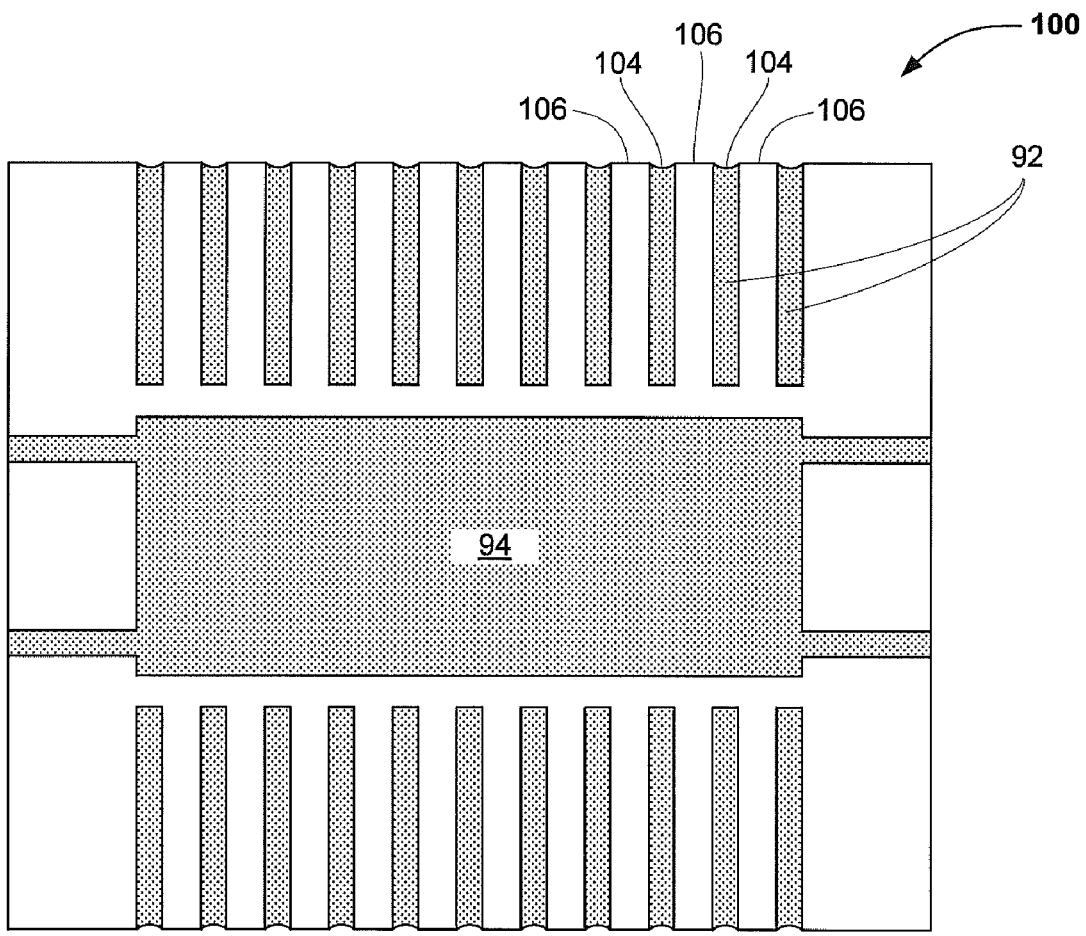
FIG. 10B is a diagrammatic sketch in a plan view showing the underside of a flat leadless package according to an embodiment of the invention.

Referring now to FIG. 10B, there is shown the underside of a leadless flat package formed by drilling and sawing as in FIG. 9. As a result of the drilling operation, the ends of the leads 92 (and the portion of the encapsulation vertically aligned with the ends of the leads) are recessed from laterally adjacent portions 106 of the surface of the package sidewall, as shown at 104. The recess may be treated, for example by printing or plating with a suitable material, as shown at 102 in FIG. 10A, to improve adhesion of a subsequently-applied interconnect material.

In the examples of drilled packages shown in the FIGs., the bores 96 are shown at the intersection of the leads 92 and the leadframe edges 98. This provides a maximum lead length for this leadframe component and, accordingly, a maximum package dimension, accommodating a maximum die width in the package. Where the dimensions of the die and electrical connections of the die and the leads permit, narrower packages having recessed lead ends can be made by locating the row of bores 96 nearer the die paddle 94, and locating the singulation loci 91 nearer the die paddle 94.

The interconnect material may be applied to the recessed lead ends by dispensing in a manner as described above with reference to FIG. 4A. Alternatively, the interconnect material may be spread over the package sidewall and then treated with a doctor blade to remove the interconnect material from the portions of the package sidewall adjacent the recessed portions, leaving the deposited material in the recesses.

Programmable Flat Leadless Packages

The packages according to the invention may optionally be made programmable or personalizable. The die may be provided with one or more "program pads". The programmable packages may be constructed so that one or more program pads on the semiconductor die or stack of the die in the package are initially electrically connected to more than one external package connection. That is, the lead frame is provided with multiple leads for each die pad that is to be assigned with the programmability option. For example, if it is desired to have the option to connect a particular die pad to either of two external circuit connections, two program leads are provided on the lead frame, and during the interconnection stage of package manufacture the die pad is electrically connected to an interconnect site that is connected to both leads. After the package has been completed, one or both (or neither) of the program leads is selectively severed from the connection site, with the result that the program pad is connected to only one of the program leads (one severed) or to neither of the program leads (both severed); or to both program leads (neither program lead severed). The severing procedure may optionally be carried out just prior to stacking the package with other package, or just prior to attaching the package to a substrate. Programmability can similarly optionally employ more than two program leads, for example three program leads, or four program leads, or any number n of leads connected to a program pad on a die or stack of die, allowing three, four, or n program choices.

The programmability options can be used in a variety of different ways to allow one package layer in a stack to uniquely respond to the electrical system to which it becomes a part of as a result of the stacking. For example, if one wanted the ability to stack eight layers, each with a unique identification, one could have three program pads present, each of which could be connected to the positive or negative supply in the system. As such, with three electrical pads, there are eight possible unique combinations of the three pads that can implemented. By initially connecting each pad to two leads of the lead frame, and thereby to two external connections of the package, each of the three pads could initially be capable of being connected to a positive or negative supply.

Severing can be carried out, for example, just prior to assembly in the stack by using a cutting tool such as a laser, to cut or open the electrical connection between the die or stack connection pad and one of the two leadframe leads, so that in the final assembly that lead is connected to only one of the two signals available.

Figure 11A:
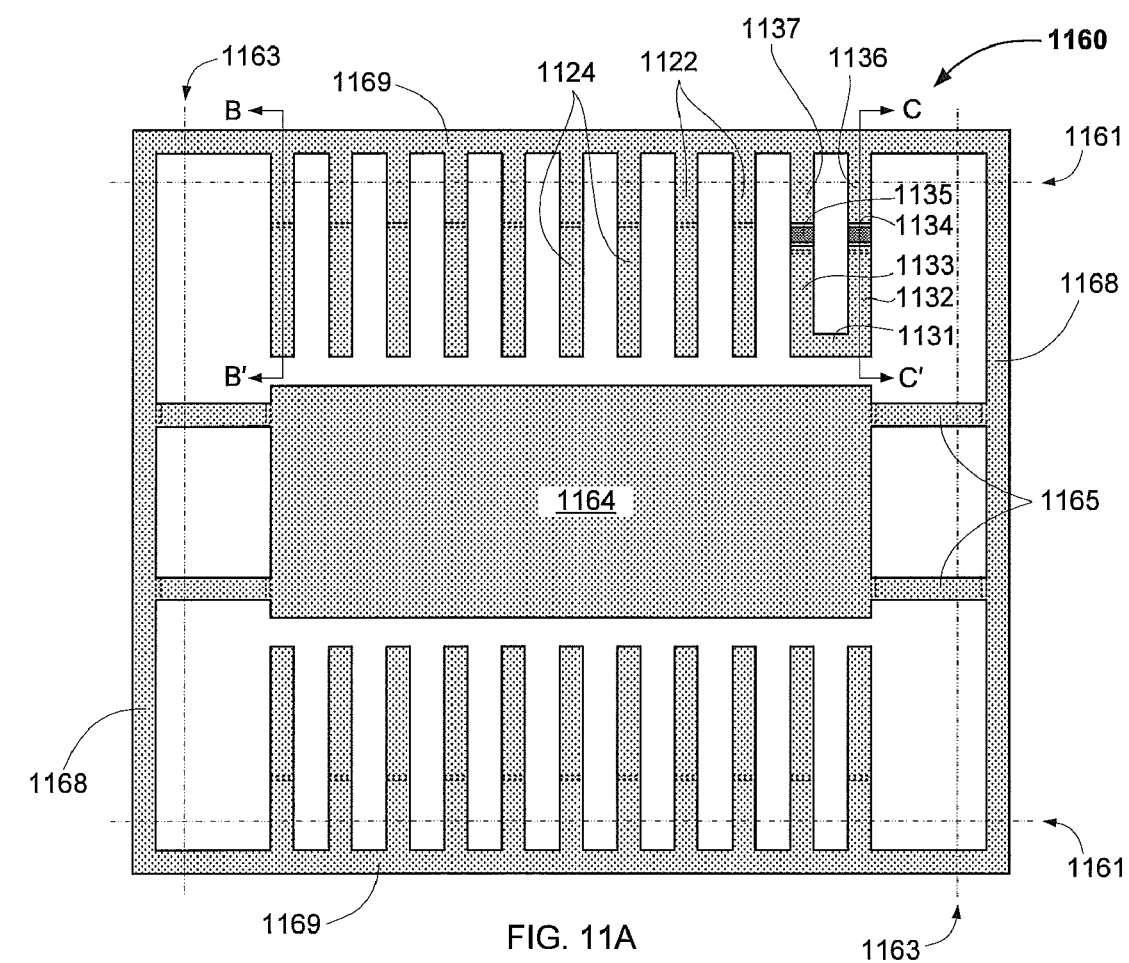
FIG. 11A is a diagrammatic sketch in plan view showing an unsingulated leadframe according to another embodiment of the invention.
Figure 11B:
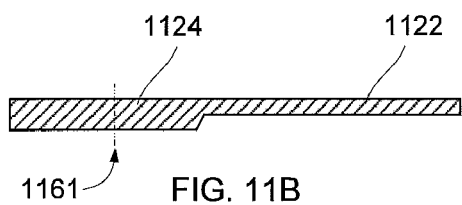
FIG. 11B is a diagrammatic sketch in a sectional view as indicated at B-B' in FIG. 11A.
Figure 11C:
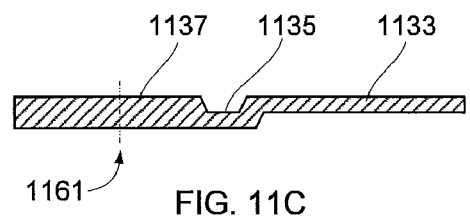
FIG. 11C is a diagrammatic sketch in a sectional view as indicated at C-C' in FIG. 11A.

One of many ways that the programmability feature can be implemented is illustrated for example in FIGS. 11A, 11B, 11C, and 12-17. Referring to FIGS. 11A, 11B, 11C, the signal leads have outer portions 1124 and inner portions 1122. The outer portions are connected to the edge portion 1169 of the leadframe construct 1160. Some leadframe material is removed from the lower side of the inner portions 1122 by, for example, partial etching. In this example there are two program leads. The program leads have outer portions 1136, 1137 and inner portions 1132, 1133. The inner portions of the program leads are joined by a bridge portion 1131. Some leadframe material is removed from the lower side of the inner portions 1132, 1133 and from the bridge portion 1131 by, for example, partial etching. As a result of removal of material from the lower side of the inner portions of the leads, following encapsulation or molding the inner portions of the signal leads and the inner portions and the bridge portion of the program leads are not exposed at the lower surface of the package body. The program leads additionally have segments 1135, 1135 which constitute the severable regions of the program leads. Some leadframe material is removed from the upper side (that is, from the die attach side) at the severability segments 1135, 1136 by, for example, partial etching. As a result of the removal of material from the upper side, the leads are thinner at the severability segments; and, following encapsulation or molding, the severability segments are exposed at the lower surface of the package body.

Figure 12:
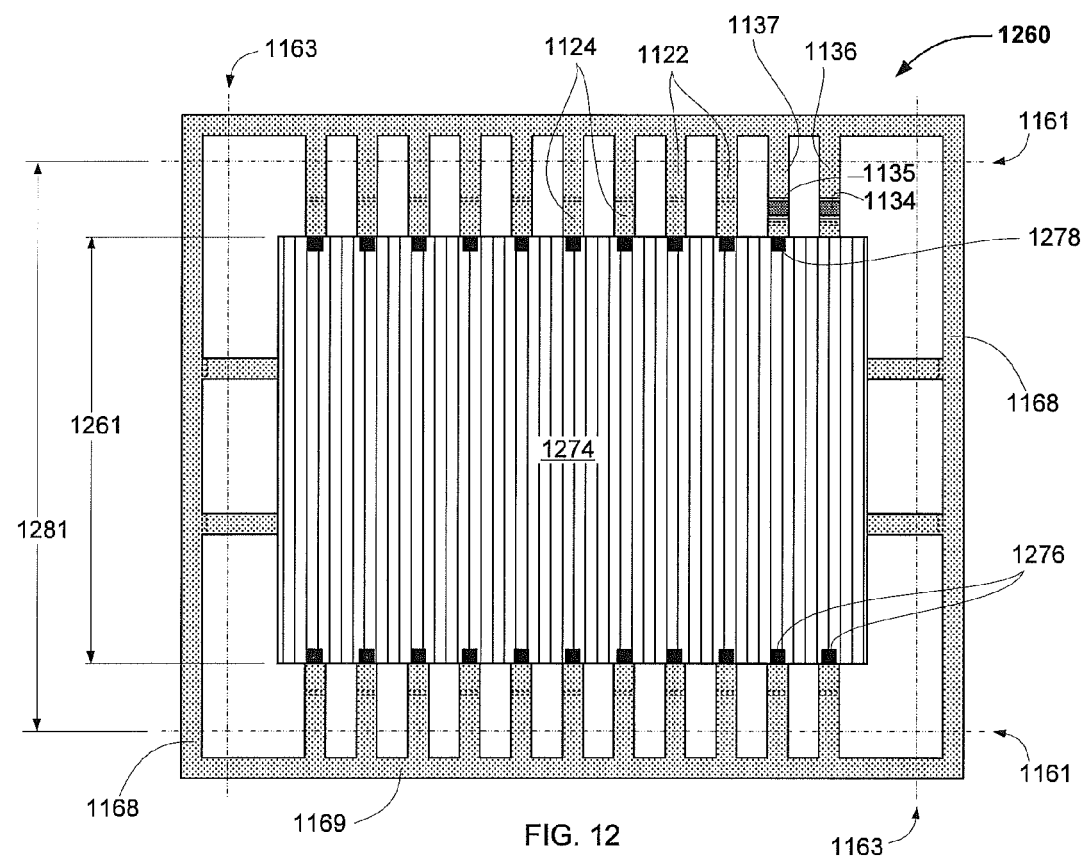
FIG. 12 is a diagrammatic sketch in a plan view showing a die, which may be the upper one of a stack of die, mounted on an unsingulated leadframe as for example in FIG. 11A according to an embodiment of the invention.

FIG. 12 shows a die 1274, which may in this view be either a single die or the topmost one of a stack of two or more die, mounted on the leadframe component of FIG. 11A. Interconnect signal pads (or interconnect terminals) 1276, and an interconnect program pad 1278 are arranged in margins adjacent opposite edges of the die 1274. The die is situated on the leadframe such that the interconnect signal pads (or interconnect terminals) on the die are generally aligned with the underlying signal leads, and such that the interconnect program pad is generally aligned with the inner portion 1133 of program lead 1137.

Figure 13:
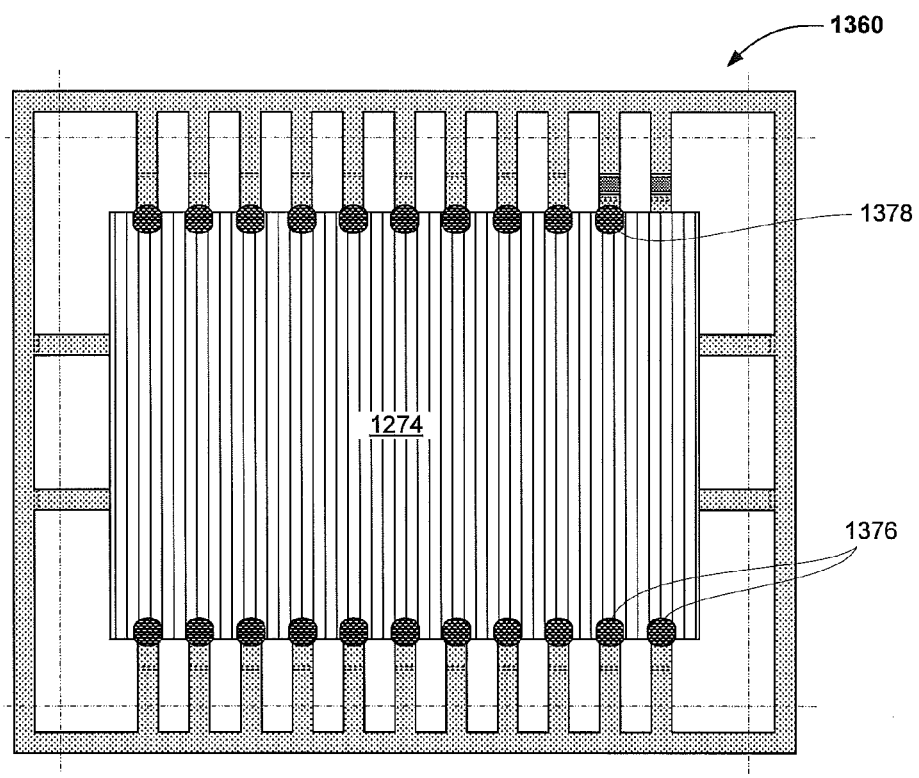
FIG. 13 is a diagrammatic sketch in a plan view showing a die and unsingulated leadframe as in FIG. 12, interconnected and connected to leads according to an embodiment of the invention.

As shown in FIG. 13, the die 1274 (together with underlying die, if any) is electrically connected to the leadframe component by conductive polymer or conductive ink interconnect material contacting the signal pads to subjacent sites on the signal leads (as indicated for example at, e.g., 1376), and contacting the program pad to a subjacent site on the program lead (as indicated at 1378). At this point in the process the program pad is electrically connected to both program leads.

Figure 14:
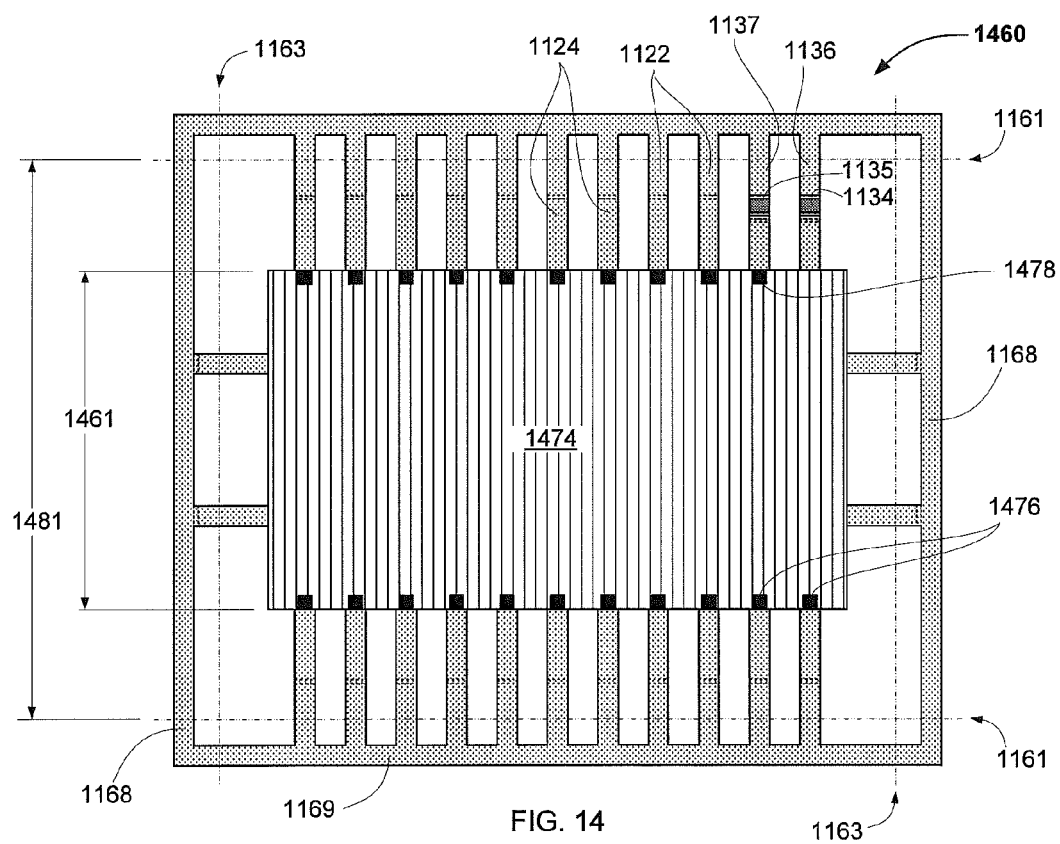
FIG. 14 is a diagrammatic sketch in a plan view showing a die, which may be the upper one of a stack of die, mounted on an unsingulated leadframe as for example in FIG. 11A according to another embodiment of the invention.
Figure 15:
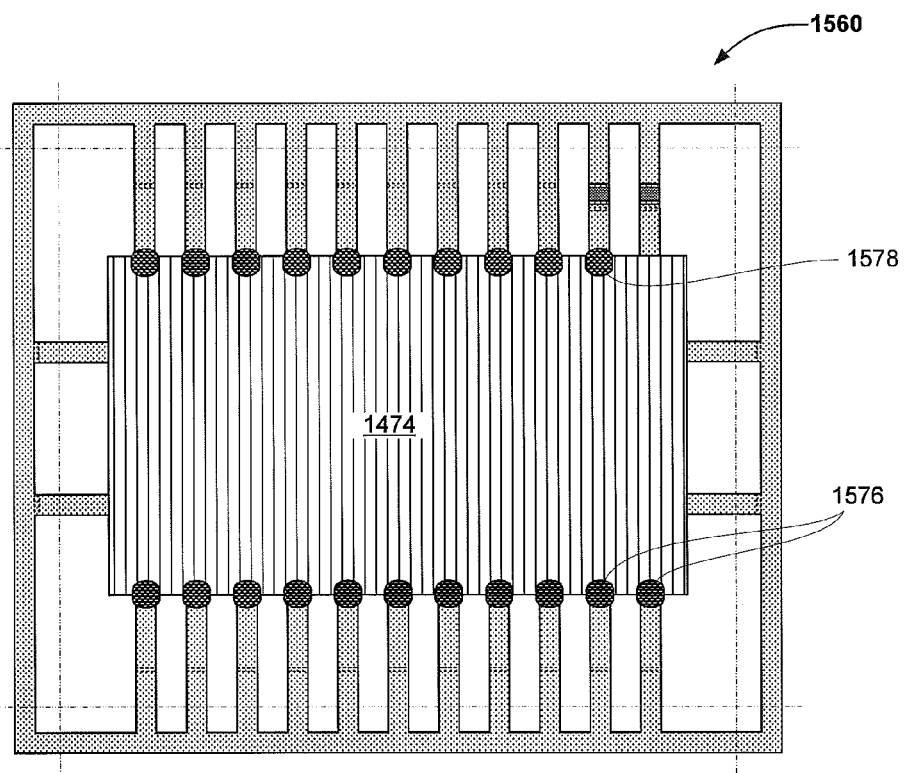
FIG. 15 is a diagrammatic sketch in a plan view showing a die and unsingulated leadframe as in FIG. 14, interconnected and connected to leads according to another embodiment of the invention.

The leadframe component 1160 can be used to mount and interconnect die having a wide range of widths, as shown by comparison of FIGS. 12 and 13 with FIGS. 14 and 15, showing similar stages of assembly; die 1274 is a wider die, having a width 1261; die 1474 is a narrower die, having as width 1461. Referring to FIG. 14, the signal pads 1476 and program pad 1478 in FIG. 14 are generally aligned with the corresponding underlying leads. As shown in FIG. 15, the die 1474 (together with underlying die, if any) is electrically connected to the leadframe component by conductive polymer or conductive ink interconnect material contacting the signal pads to subjacent sites on the signal leads (as indicated for example at, e.g., 1576), and contacting the program pad to a subjacent site on the program lead (as indicated at 1578), and, as in the assembly having a wider die, at this point in the process the program pad 1478 is electrically connected to both program leads.

Figure 16:
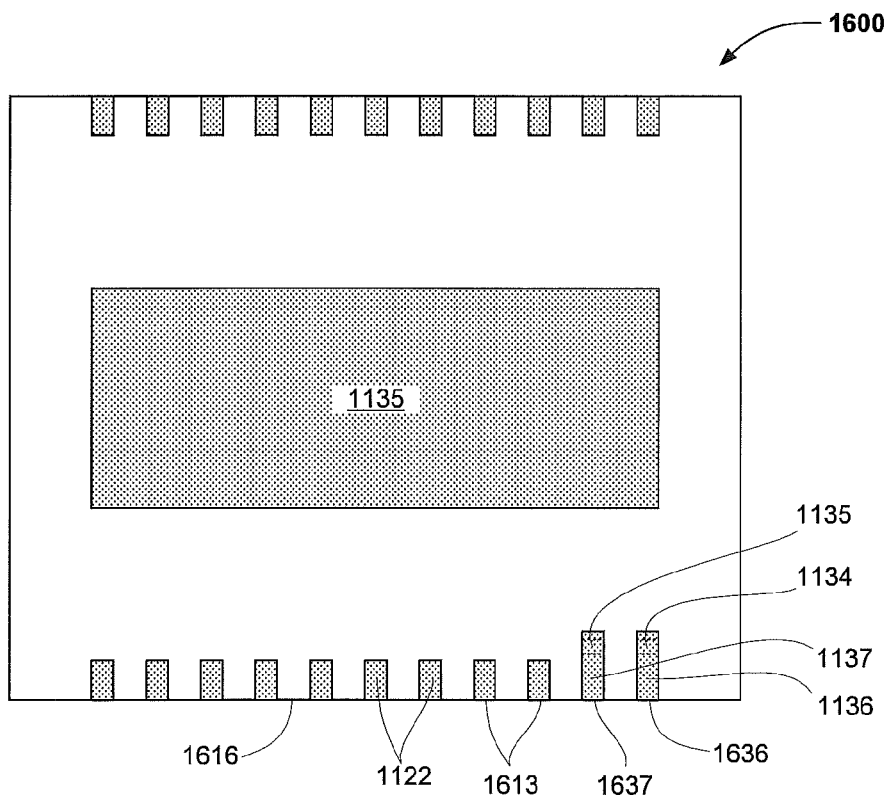
FIG. 16 is a diagrammatic sketch in a plan view showing the underside of a programmable flat leadless package according to an embodiment of the invention.

The assembly is encapsulated or molded, and then the package is singulated by sawing or punching along the singulation loci 1161, 1163. FIG. 16 shows generally at 1600 the underside of a resulting programmable flat leadless package. Exposed at the underside of the package body are the die paddle 1135; the outer portions 1122 of the signal leads; and the outer portions 1636, 1637, and severability portions 1134, 1135 of the program leads. Exposed at the sidewalls of the singulated die are the lead ends 1613 of the signal leads, and the lead ends 1636, 1637 of the program leads. The lead ends are in this example flush with the adjacent portions 1616 of the package sidewall.

Figure 17:
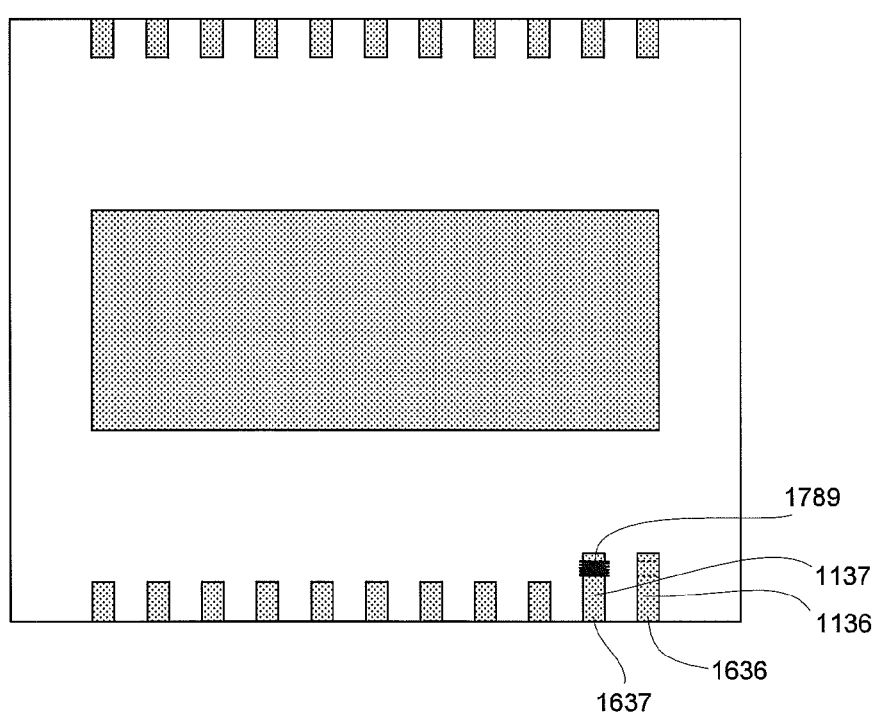
FIG. 17 is a diagrammatic sketch in a plan view showing the underside of a flat leadless package as in FIG. 16, programmed according to an embodiment of the invention.

FIG. 17 shows generally at 1700 a package as in FIG. 16, programmed by severing the program lead 1137, as indicated at 1789. As a result the program pad on the die (or die stack) within the package is addressable at the lead end 1636 or by the outer portion of program lead 1136; but the die (or stack of die) is not addressable at the lead end 1637 or by the outer portion of program lead 1137. More particularly, electrical continuity between the program pad 1278 (or 1478) and the program lead end 1636 is made by way of the interconnect 1378 (or 1578) to the inner program lead portion 1133, through the bridge portion 1131, the inner program lead portion 1132, the (unsevered) segment 1134 and the outer program lead portion 1136.

The programmable package as in FIG. 16 might alternatively have been programmed by severing the program lead 1136. As a result the program lead on the die (or die stack) within the package would have been addressable at the lead end 1637 or by the outer portion of program lead 1137, but not by the lead end 1636 or by the outer portion of program lead 1136. Or, the programmable package as in FIG. 16 might alternatively have been programmed by severing both the program lead 1136 and the program lead 1137. As a result the program lead on the die (or die stack) within the package would not have been addressable at either the lead end 1636 or the lead end 1637, and the resulting connection would be floating. A floating configuration may be valuable where the die or die stack has been designed so that the program die pad recognizes three possible states (low, high, and open or floating.) There are many other alternative embodiments of multiple package pins for one or more die or die stack pins. For example, although the example described above illustrates case where there are two leadframe leads for one die pad, and another die pad also uses one of the lead frame leads, other embodiments are contemplated whereby one die pad can have two, or three, or four, or any number n of program leads associated with it as choices for external package connections with or without the presence of any other die pads sharing or using these same lead frame leads. Similarly, co-joined, or temporarily bridged leads do not need to be positioned at the corner of the die, as shown in FIG. 11A, but can be positioned anywhere along the edge of the die to provide a programmable option for any or multiple die pads located anywhere on the die or die stack.

Following interconnection, the package (or row or array of packages) is encapsulated or molded, and then the packages are singulated.

FIG. 16 shows the underside of a resulting programmable package 1600. On the underside of the package in this example the underside of the die paddle 1164 and the outer portions 1122 of the signal leads are exposed; and, in addition, the underside of the outer portions 1136, 1137 of the program leads, and the underside of the severable portions 1134, 1135 of the program leads, are exposed. As may be appreciated, all the lead ends 1613 are exposed at the package sidewall 1616. Programming is carried out by severing one, or both, or neither of the program leads by cutting through the appropriate severable portion 1134 or 1135 from the underside, for example using a laser. FIG. 17 shows such a package, which has been programmed in this example by cutting through the severable portion of lead 1182, as shown at 1789. As a result, the program die pad (1478 in FIG. 14; 1278 in FIG. 12) within the package can be accessed by way of lead 1137, but is not accessible through lead 1136. In this example there are two choices for the program die pad. Alternatively, in other embodiments, there can be three choices, or four choices, or any desirable number (n) of choices. As explained above, the program die pad can be initially electrically connected to all the available choices, and late in the manufacturing process a laser or other tool can be used to selectively sever one or more of the connections in an appropriate pattern that provides a unique set of connections or electrical signals to one of more die pads on each of the layers to be connected together in a stack.

The programming step can be carried out prior to stacking the package with other packages in a module; and optionally the package ca be tested prior to programming, and a programming decision can be made on the basis of the results of the test.

Stacked package units or assemblies constructed according to the invention can be electrically interconnected with circuitry in a device for use. For example, a stacked package unit can be mounted upon another package, or on the active side of a larger die, and electrically interconnected by connection of all or selected ones of the lead ends of the unit with interconnect sites on the substrate or pads on the die. Or, for example, a package stack assembly can be mounted on a substrate, and electrically interconnected by connection of all or selected ones of the interconnect ends of the unit with leads in the substrate.

The raw materials employed in the packages of the invention can be inexpensive. Flat leadless packages, and package assemblies and stacked package modules, can be inexpensive, as compared with packages on substrates, for example, particularly for packaging larger die. A standardized leadframe component (row or array) can be employed for mounting die having a range of widths. The flat leadless packages can be made minimally thin, and can have a footprint only incrementally larger than the largest die in the package.

The flat leadless packages can be highly robust and reliable. The starting materials are uncomplicated and reliable, and the thermal characteristics of the leadframe, die, and encapsulant can be well matched.

Other embodiments are within the claims. For example, the interconnect material may alternatively include a sintered electrically conductive ink, and may be applied as traces in a sinterable form and subsequently treated to sinter the traces. Or, for example, the interconnect material may include a metal or metallization patterned by plating onto an electroless plating catalyst printed or deposited in the desired pattern of traces.

We claim:

1. A flat leadless package comprising a leadframe comprising a plurality of leads and a plurality of die in a stack mounted onto the leadframe and electrically connected to at least some of said leads by an interconnect material comprising an electrically conductive polymer or an electrically conductive ink.

2. The package of claim 1 wherein at least one said die is mounted die-down.

3. The package of claim 1 wherein at least one said die is mounted die-up.

4. The package of claim 1 wherein at least one die in the stack is oriented die-up and at least one die in the stack is oriented die-down.

5. The package of claim 1 wherein the die in the stack all have the same dimensions.

6. The package of claim 1 wherein at least one die in the stack is dimensioned differently from at least one other die in the stack.

7. The package of claim 1 wherein die pads are arranged in at least one row in a margin along or adjacent at least one interconnect edge.

8. The package of claim 7 wherein an interconnect edge of a first die in the stack overlies an interconnect edge in a second die in the stack.

9. The package of claim 7 wherein an interconnect edge of a first die in a stack is offset in relation to an interconnect edge of a second die in the stack.

10. The package of claim 1 wherein the interconnect material comprises an electrically conductive polymer.

11. The package of claim 1 wherein the interconnect material comprises a polymer filled with conductive material in particle form.

12. The package of claim 1 wherein the interconnect material comprises a material selected from: a metal filled epoxy, a metal filled thermosetting polymer, a metal filled thermoplastic polymer, an electrically conductive ink.

13. The package of claim 1 wherein the interconnect material comprises a curable material.

14. The package of claim 1 wherein the interconnect material comprises a sintered electrically conductive ink.

15. The package of claim 1 wherein the interconnect material comprises a metallization plated onto a printed electroless plating catalyst.

16. An assembly of stacked flat leadless packages having lead ends exposed at least one sidewall thereof, wherein the packages are interconnected using an electrically conductive polymer or an electrically conductive ink.

17. The assembly of claim 16 wherein at least one said package is a flat leadless package containing at least one wire bonded die.

18. The assembly of claim 16 wherein at least one said package is a flat leadless package containing at least one flip-chip die.

19. The assembly of claim 16 wherein at least one said package is a flat leadless package having at least one die mounted onto a leadframe and electrically connected to leads using an electrically conductive polymer or an electrically conductive ink.

20. The assembly of claim 16 wherein the end surfaces of the leads are generally flush with at least a portion of the sidewall.

21. The assembly of claim 16 wherein the end surfaces of the leads are recessed with respect to a plane of at least a portion of the sidewall.

22. The assembly of claim 16 wherein at least one said package includes one or more stacks of die.

23. The assembly of claim 16 wherein the packages in a stack are all the same type of package.

24. The assembly of claim 16 wherein at least one said package is a type different from at least one other package.

25. The assembly of claim 16 wherein the packages in a stack have the same dimensions.

26. The assembly of claim 16 wherein at least one package in a stack is dimensioned differently from at least one other package in a stack.

27. A package module comprising a flat leadless package having lead ends exposed at least one sidewall thereof, electrically connected to circuitry in an underlying support using an electrically conductive polymer or an electrically conductive ink.

28. A package module, comprising a plurality of stacked flat leadless packages having lead ends exposed at least one sidewall thereof, interconnected using an electrically conductive polymer or an electrically conductive ink.

29. The package module of claim 27 wherein the underlying support comprises a printed circuit board.

30. The package module of claim 27 wherein the underlying support comprises a module leadframe.

31. The package module of claim 28 wherein the packages in a stack have the same dimensions.

32. The package module of claim 28 wherein at least one package in a stack is dimensioned differently from at least one other package in a stack.

33. The package module of claim 27 wherein the underlying support comprises a printed circuit board.

34. The package module of claim 27 wherein the underlying support comprises a module leadframe.

* * * * *

UNITED STATES PATENT AND TRADEMARK OFFICE
CERTIFICATE OF CORRECTION

PATENT NO.        : 7,843,046 B2                              Page 1 of 1
APPLICATION NO.   : 12/199667
DATED             : November 30, 2010
INVENTOR(S)       : Lawrence Douglas Andrews, Jr. et al.

It is certified that error appears in the above-identified patent and that said Letters Patent is hereby corrected as shown below:

Column 18, line 9, (second line in claim 16): delete "at least" and insert --at at least-- in place thereof.

Column 18, line 41, (second line in claim 27): delete "at least" and insert --at at least-- in place thereof.

Column 18, line 46, (second line in claim 28): delete "at least" and insert --at at least-- in place thereof.

Signed and Sealed this
Eighteenth Day of January, 2011

David J. Kappos
*Director of the United States Patent and Trademark Office*